(12) United States Patent
Zhang et al.

(10) Patent No.: US 12,242,201 B2
(45) Date of Patent: Mar. 4, 2025

(54) DETERMINING HOT SPOT RANKING BASED ON WAFER MEASUREMENT

(71) Applicant: ASML NETHERLANDS B.V., Veldhoven (NL)

(72) Inventors: Youping Zhang, Cupertino, CA (US); Weixuan Hu, Shenzhen (CN); Fei Yan, Shenzhen (CN); Wei Peng, Shenzhen (CN); Vivek Kumar Jain, Fremont, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 756 days.

(21) Appl. No.: 17/276,533

(22) PCT Filed: Sep. 20, 2019

(86) PCT No.: PCT/EP2019/075326
§ 371 (c)(1),
(2) Date: Mar. 16, 2021

(87) PCT Pub. No.: WO2020/064544
PCT Pub. Date: Apr. 2, 2020

(65) Prior Publication Data
US 2022/0035256 A1 Feb. 3, 2022

Related U.S. Application Data

(60) Provisional application No. 62/738,775, filed on Sep. 28, 2018.

(51) Int. Cl.
*G03F 7/00* (2006.01)
(52) U.S. Cl.
CPC ...... *G03F 7/70525* (2013.01); *G03F 7/70641* (2013.01); *G03F 7/7065* (2013.01); *G03F 7/7085* (2013.01)

(58) Field of Classification Search
CPC ............. G03F 7/70525; G03F 7/70641; G03F 7/7065; G03F 7/7085; G03F 7/705
See application file for complete search history.

(56) References Cited

U.S. PATENT DOCUMENTS 6,961,116 B2 11/2005 Den Boef et al.
7,587,704 B2 9/2009 Ye et al.
(Continued)

FOREIGN PATENT DOCUMENTS

TW 201633006 9/2016
WO 2009078708 6/2009
(Continued)

OTHER PUBLICATIONS

International Search Report and Written Opinion issued in corresponding PCT Patent Application No. PCT/EP2019/075326, dated Dec. 3, 2019.
(Continued)

*Primary Examiner* — Nghia M Doan
(74) *Attorney, Agent, or Firm* — Pillsbury Winthrop Shaw Pittman LLP

(57) ABSTRACT

A method of hot spot ranking for a patterning process. The method includes obtaining (i) a set of hot spots of a patterning process, (ii) measured values of one or more parameters of the patterning process corresponding to the set of hot spots, and (ii) simulated values of the one or more parameters of the patterning process corresponding to the set of hot spots; determining a measurement feedback based on the measured values and the simulated values of the one or more parameters of the patterning process; and determining, via simulation of a process model of the patterning process, a ranking of a hot spot within the set of hot spots based on the measurement feedback.

21 Claims, 23 Drawing Sheets

(56) References Cited

U.S. PATENT DOCUMENTS

| | | | |
|---|---|---|---|
| 7,689,948 B1* | 3/2010 | White | G06F 30/3323 |
| | | | 714/25 |
| 8,200,468 B2 | 6/2012 | Ye et al. | |
| 8,411,287 B2 | 4/2013 | Smilde et al. | |
| 8,867,020 B2 | 10/2014 | Smilde et al. | |
| 9,081,303 B2 | 7/2015 | Cramer et al. | |
| 10,514,614 B2 | 12/2019 | Vellanki et al. | |
| 10,755,025 B2 | 8/2020 | Chen et al. | |
| 10,859,926 B2 | 12/2020 | Hunsche et al. | |
| 2006/0066855 A1 | 3/2006 | Den Boef et al. | |
| 2006/0273266 A1* | 12/2006 | Preil | G03F 7/70666 |
| | | | 430/311 |
| 2009/0157360 A1 | 6/2009 | Ye et al. | |
| 2011/0027704 A1 | 2/2011 | Cramer et al. | |
| 2011/0043791 A1 | 2/2011 | Smilde et al. | |
| 2012/0216156 A1* | 8/2012 | Liu | G03F 7/70666 |
| | | | 716/52 |
| 2012/0242970 A1 | 9/2012 | Smilde et al. | |
| 2013/0031518 A1 | 1/2013 | Robles et al. | |
| 2015/0346610 A1* | 12/2015 | Tam | G03F 7/70666 |
| | | | 355/55 |
| 2015/0356233 A1 | 12/2015 | Fouquet et al. | |
| 2018/0259858 A1* | 9/2018 | Chen | G03F 7/70558 |
| 2019/0072858 A1* | 3/2019 | Saraswatula | G03F 1/84 |

FOREIGN PATENT DOCUMENTS

| | | |
|---|---|---|
| WO | 2009106279 | 9/2009 |
| WO | 2017080729 | 5/2017 |
| WO | 2018114246 | 6/2018 |

OTHER PUBLICATIONS

Fanton P. et al: "Advanced in-production hotspot prediction and monitoring with micro-topograpphy", Proc. of SPIE, vol. 10145, Mar. 28, 2017.

Jochemsen M. et al: "Process window limiting hot spot monitoring for high-volume manufacturing", Proc. of SPIE, vol. 9778, Mar. 8, 2016.

Ham B. et al.: "The use of computational inspection to identify process window limiting hotspots and predict sub-15nm defects with high capture rate", Proc. of SPIE, vol. 10145, Mar. 28, 2017.

* cited by examiner

DETERMINING HOT SPOT RANKING BASED ON WAFER MEASUREMENT

CROSS-REFERENCE TO RELATED APPLICATIONS

This application is the U.S. national phase entry of PCT Patent Application No. PCT/EP2019/075326, which was filed on Sep. 20, 2019, which claims the benefit of priority of U.S. Patent Application No. 62/738,775, which was filed on Sep. 28, 2018 and which is incorporated herein in its entirety by reference.

FIELD

The present disclosure relates to techniques of improving the performance of a device manufacturing process. The techniques may be used in connection with a lithographic apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Described herein is a method of hot spot ranking for a patterning process according to an embodiment of the present disclosure. The method includes obtaining (i) a set of hot spots of a patterning process, (ii) measured values of parameters of the patterning process corresponding to the set of hot spots, and (ii) simulated values of the parameters of the patterning process corresponding to the set of hot spots; determining, via a hardware computer system, a measurement feedback based on the measured values and the simulated values of the parameters of the patterning process; and determining, via simulation of a process model of the patterning process, a ranking of a hot spot within the set of hot spots, generated by the simulation, based on the measurement feedback.

In an embodiment, the measurement feedback is a bias function determined as a difference between a first function representing the measured values and a second function representing the simulated values.

In an embodiment, the determining the measurement feedback includes categorizing hot spots within the set of hot spots in one or more categories; and determining the bias function for a particular category of the hot spot based on the measured values of the parameters of the patterning process and the simulated values of the parameters of the patterning process.

In an embodiment, the determining the bias function includes determining the first function fitting the measured values; determining the second function corresponding to the process model of the patterning process used to generate the simulated values; and determining the difference between the first function and the second function.

In an embodiment, the first function and/or the second function is a mathematical model and/or a look up table.

In an embodiment, the measurement feedback is a maximum value of a difference between the measured values and the simulated values.

In an embodiment, the measurement feedback is an average value of a difference between the measured values and the simulated values corresponding to a category of the hot spot within the set of the hot spots.

In an embodiment, the determining the ranking of the hot spot includes determining the category of one or more hot spots of the set of hot spots; applying the bias function corresponding to the category to generate a biased version of the one or more hot spot; and determining, via simulation of a ranking algorithm of the process model of the patterning process, the ranking of the biased hot spot.

In an embodiment, the ranking algorithm includes determining a defect metric corresponding to each of the hot spot within the set of hot spot, wherein the defect metric is evaluated within a focus uncertainty range.

In an embodiment, the defect metric is a weighted sum of a difference between a defect size and a threshold defect size at different focus values within the focus uncertainty range.

In an embodiment, the method further includes guiding, via the hardware computer system, an inspection tool to collect measurement data on a printed substrate according to the ranking of the hot spots; and determining, via the hardware computer system, defects on the printed substrate based on the measurement data.

In an embodiment, the determining the measurement feedback is an iterative process, an iteration includes obtaining defect data corresponding to the set of hot spots; determining a correlation between the defect data and hot spot ranking; evaluating a level of the correlation; and responsive to the level of correlation breaching a threshold, determining the measurement feedback.

In an embodiment, the category is based on a pattern type and/or values of parameters of the patterning process.

In an embodiment, the pattern type is determined based on geometric shapes of the features within the hot spot.

In an embodiment, the parameters of the patterning process includes a critical dimension, a dose, and/or a focus.

Furthermore, in an embodiment there is provided a method of hot spot ranking for a patterning process. The method includes obtaining (i) a set of hot spots, (ii) simulated values of a parameter of the patterning process corresponding to the set of hot spots, and (iii) an initial ranking of one or more hot spots of the set of hot spots; obtaining, via a metrology tool, defect data from an exposed wafer; determining a correlation between the defect data and the initial hot spot ranking; determining whether the correlation breaches a threshold value; responsive to breaching of a threshold, determining a measurement feedback based on the simulated values and the defect data; adjusting the simulated values of the parameter of the patterning process to include the measurement feedback; and determining, via simulation of a ranking algorithm, a ranking of the set of hot spot patterns based on the adjusted values of the parameter of the patterning process.

In an embodiment, the measurement feedback includes obtaining, via the metrology tool, measured values of the parameter corresponding to the defect data; and determining the measurement feedback based on a difference between the measured values and the simulated values.

In an embodiment, determining the measurement feedback includes grouping one or more hot spots of the set of hot spots based on a pattern type or values of parameters of the patterning process; and determining an average measurement feedback per hot spot group.

In an embodiment, the simulated values are adjusted based on the average measurement feedback per hot spot group.

In an embodiment, the parameters of the patterning process includes focus and/or exposure.

In an embodiment, the measurement feedback is a maximum value of the difference between the measured values and the simulated values.

DETAILED DESCRIPTION

Before describing embodiments in detail, it is instructive to present an example environment in which embodiments may be implemented.

Figure 1:
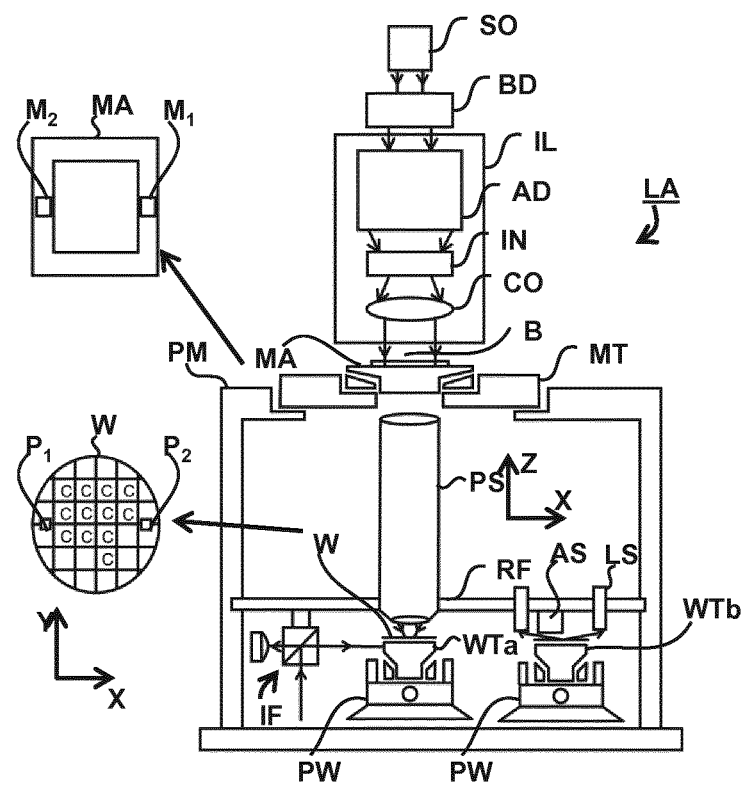
FIG. 1 schematically depicts a lithography apparatus according to an embodiment, according to an embodiment.

FIG. 1 schematically depicts an embodiment of a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as G-outer and G-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. This is non exhaustive list of defects and additional defect types and corresponding defect detectors may be defined. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
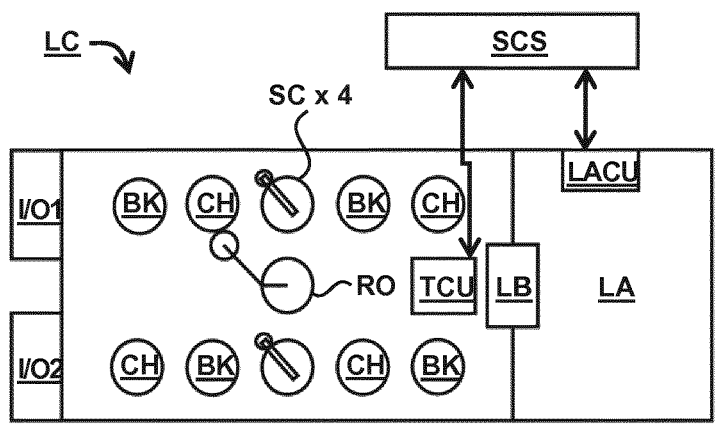
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the $-1^{st}$ and $+1^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
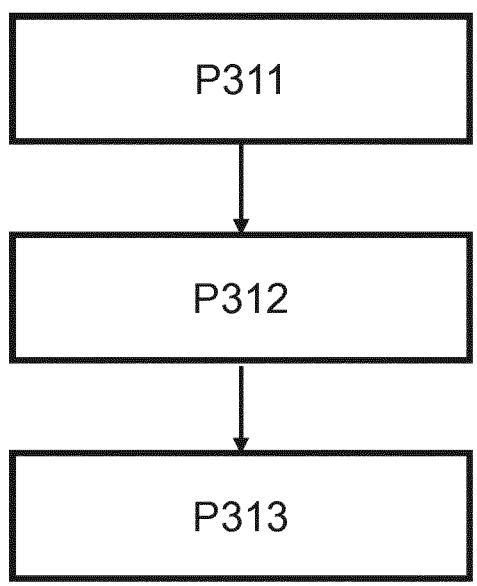
FIG. 3 shows a flow chart for a method of determining existence of defects in a lithography process, according to an embodiment.

FIG. 3 shows a flow chart for a method of determining existence of hot spots (or defects therefrom) in a lithography process, according to an embodiment. In process P311, hot spots or locations thereof are identified using any suitable method from patterns (e.g., patterns on a patterning device). For example, hot spots may be identified by analyzing patterns on a patterning device using an empirical model or a computational model. In an empirical model, images (e.g., resist image, optical image, etch image) of the patterns are not simulated; instead, the empirical model predicts hot spots based on correlations between processing parameters, parameters of the patterns, and the hot spots. For example, an empirical model may be a classification model or a database of patterns prone to defects. In a computational model, a portion or a characteristic of the images is calculated or simulated, and hot spots are identified based on the portion or the characteristic. For example, a line pull back defect/hot spot may be identified by finding a line end too far away from its desired location; a bridging defect/hot spot may be identified by finding a location where two lines undesirably join; an overlapping defect/hot spot may be identified by finding two features on separate layers undesirably overlap or undesirably not overlap. An empirical model is usually less computationally expensive than a computational model. It is possible to determine and/or compile process windows of the hot spots into a map, based on hotspot locations and process windows of individual hot spots—i.e. determine process windows as a function of location. This process window map may characterize the layout-specific sensitivities and processing margins of the patterns. In another example, the hot spots, their locations, and/or their process windows may be determined experimentally, such as by FEM wafer inspection or a suitable metrology tool. A set of defects/hot spots may include those defects/hot spots that cannot be detected in an after-development-inspection (ADI) (usually optical inspection), such as resist top loss, resist undercut, etc. Conventional inspection only reveals such defects/hot spots after the substrate is irreversibly processed (e.g., etched), at which point the wafer cannot be reworked. So, such resist top loss defects cannot be detected using the current optical technology at the time of drafting this document. However, simulation may be used to determine where resist top loss may occur and what the severity would be. Based on this information, it may be either decided to inspect the specific hotspots/possible-defect using a more accurate inspection method (and typically more time consuming) to determine whether the defect/wafer needs rework, or it may be decided to rework the imaging of the specific resist layer (remove the resist layer having the resist top loss defect and recoat the wafer to redo the imaging of the specific layer) before the irreversible processing (e.g., etching) is done.

In process P312, processing parameters under which the hot spots are processed (e.g., imaged or etched onto a substrate) are determined. The processing parameters may be local—dependent on the locations of the hot spots, the dies, or both. The processing parameters may be global—independent of the locations of the hot spots and the dies. One exemplary way to determine the processing parameters is to determine the status of the lithographic apparatus. For example, laser bandwidth, focus, dose, source parameters, projection optics parameters, and the spatial or temporal variations of these parameters, may be measured from the lithographic apparatus. Another exemplary way is to infer the processing parameters from data obtained from metrology performed on the substrate, or from operator of the processing apparatus. For example, metrology may include inspecting a substrate using a diffractive tool (e.g., ASML YieldStar), an electron microscope, or other suitable inspection tools. It is possible to obtain processing parameters for any location on a processed substrate, including the identified hot spots. The processing parameters may be compiled into a map—lithographic parameters, or process conditions, as a function of location. Of course, other processing parameters may be represented as functions of location, i.e., a map. In an embodiment, the processing parameters may be determined before, and preferably immediately before processing each hotspot.

In process P313, existence, probability of existence, characteristics, or a combination thereof, of a defect at a hot spot is determined using the processing parameters under which the hot spot is processed. This determination may be simply comparing the processing parameters and the process window of the hot spot—if the processing parameters fall within the process window, no defect exists; if the processing parameters fall outside the process window, at least one defect will be expected to exist. This determination may also be done using a suitable empirical model (including a statistical model). For example, a classification model may be used to provide a probability of existence of a defect. Another way to make this determination is to use a computational model to simulate an image or expected patterning contours of the hot spot under the processing parameters and measure the image or contour parameters. In an embodiment, the processing parameters may be determined immediately (i.e., before processing the pattern or the next substrate) after processing a pattern or a substrate. The determined existence and/or characteristics of a defect may serve as a basis for a decision of disposition: rework or acceptance. In an embodiment, the processing parameters may be used to calculate moving averages of the lithographic parameters. Moving averages are useful to capture long term drifts of the lithographic parameters, without distraction by short term fluctuations.

In an embodiment, hot spots are detected based on the simulated image of pattern on a substrate. Once the simulation of the patterning process (e.g., including process models such OPC and manufacturability check) is complete, potential weak points, i.e., hot spots, in the design as a function of process conditions may be computed according to one or more definitions (e.g., certain rules, thresholds, or metrics). Hot spots may be determined based on absolute CD values, on the rate of change of CD vs. one or more of the parameters that were varied in the simulation ("CD sensitivity"), on the slope of the aerial image intensity, or on NILS (i.e., "edge slope," or "normalized image log slope," often abbreviated as "NILS." Indicating lack of sharpness or image blur) where the edge of the resist feature is expected (computed from a simple threshold/bias model or a more complete resist model). Alternatively, hot spots may be determined based on a set of predetermined rules such as those used in a design rule checking system, including, but not limited to, line-end pullback, corner rounding, proximity to neighboring features, pattern necking or pinching, and other metrics of pattern deformation relative to the desired pattern. The CD sensitivity to small changes in mask CD is a particularly important lithographic parameter known as MEF (Mask Error Factor) or MEEF (Mask Error Enhancement Factor). Computation of MEF vs. focus and exposure provides a critical metric of the probability that mask process variation convolved with wafer process variation will result in unacceptable pattern degradation of a particular pattern element. Hot spots can also be identified based on variation in overlay errors relative to underlying or subsequent process layers and CD variation or by sensitivity to variations in overlay and/or CD between exposures in a multiple-exposure process.

In an embodiment, pattern fidelity metrology may be performed as guided defect inspection, where simulation tool is used to identify patterns that are likely to fail, which guides the inspection system to locations in wafer where the identified patterns are located to improve efficiency of the inspection system. The inspection system acquires and analyzes pattern/hotspot/defect images on wafer. For example, wafer images may be acquired from reflected image of an optical system (dark field or bright field inspection systems), or electron beam (e-beam) system.

The e-beam system has the advantage of having much higher resolution than optical system, but it's also very slow and scanning the entire wafer image is not practical. To speed up the e-beam inspection (or even the optical system), simulations are configured to guide the inspection system to look at areas on the wafer where the likelihood of defects occurrence is relatively higher within the wafer. By doing so, the inspection process may be speed up by several order magnitude without loss in defect capturing accuracy.

Each chip design contain huge number of patterns, only a small percent of patterns are likely to result in defect. For example, such patterns are referred as hot spots or hot spot patterns. Defects occur due to process variations (e.g., variations in process parameters such as focus and dose) and hot spots refer to those patterns that may fail first or have higher likelihood of failure due to such process variations. Process simulations may be performed to identify hot spots without requiring actual wafer and the inspection tool.

Thus, guided inspection employs simulation to identify a very small number of hot spots relative to an entire design layout of chip or a wafer, and then drive the inspection system to focus on inspecting areas on a wafer corresponding to hot spot patterns and not inspecting the rest, thereby gaining orders of magnitude throughput gain.

Various aspects of pattern fidelity metrology and methods of hot spot determination or validation are discussed in detail in different patents/patent applications, which are incorporated herein in their entirety by reference. For example, U.S. patent application Ser. No. 15/546,592 describes a process variability aware adaptive inspection and metrology that discusses, for example, a defect prediction method based on variations in process parameters for finding defects. U.S. patent application Ser. No. 15/821,051 describes a hot spot identification based on process window or over lapping process window of an area of interest (e.g., a processing window limiting pattern or hot spot pattern) of a design layout. U.S. patent application Ser. No. 15/580,515 describes methods for defect validation that aligning the metrology image and the first image (e.g., a simulated image) of a wafer and employs verification flow and threshold feedback related to alignment/misalignment of the images. PCT patent application publication WO2017080729A1 describes methods for identifying a process window boundary that improves finding of hot spots.

Existing computational lithography related solutions (e.g., pattern fidelity metrology/monitoring for wafer defect inspection, as discussed earlier) employs modules (e.g., software) such as Computational Hotspot Detection (CHD) which uses computational lithography model to identify hot spots in the full chip to guide an inspection apparatus (e.g., e-beam). CHD is configured to perform beyond OPC verification (e.g., defects related to OPC) and find process window defects and may also generates hundreds of thousands of hot spots for a full chip design. Due to a quick turn-around-time requirement and relatively low speed of making measurements using the inspection tool, inspection of only a small fraction (e.g., thousands out of a million) of the hot spots for full wafer may be performed. To address this problem computation models employ a ranking indicator (also referred as a rank) to indicate a severity of each hot spots. The severity of hot spot is a measure of how likely the hot spot pattern will transform into real wafer defects. A high severity hot spot means it is likely to transform into defects, and actual counts of such defects associated with the hot spot is likely it be relatively high compared to other patterns. Therefore, such hot spot will also be ranked high. Whereas a low severity hot spots means it is less likely to transform into defects and actual defects counts on wafer will likely to be small or non-existent. Such hot spot will be ranked low.

Based on the ranking, the inspection system may select a small fraction of the hot spots (e.g., hot spots having relatively higher rank) for defect inspection. Therefore, accurate identification of the hot spots and their severity/ranking is important to ensure a high capture rate (i.e., more true positives or more data that reveals defects related to patterns) and low nuisance rate (i.e., less false positive or less data related to non-defective patterns).

As mentioned earlier, measurements via a metrology tool are performed on limited number of selected location (e.g., hot spot locations) on a printed wafer due to an amount of time and resources required to make measurements. In an embodiment, incorrect hot spot ranking may guide an inspection apparatus to less critical (e.g., non-hot spot locations) locations on a printed substrate, thereby spending (or wasting) tool time for inspecting patterns that are unlikely to be real defects. For example, a non-representative measurement sample may include some measurements that may not reveal defects, while some defects may be missed. For example, critical hot spot patterns, which are deemed unlikely to be real defects based on incorrect low ranking of the hot spots, are skipped resulting in real defect being missed. In an embodiment, the missed hot spot measurements may result in missing out information related to frequently occurring defects. When such inaccurate measurements are used to improve the patterning process, desired result (e.g., desired yield or process improvement) may not be observed.

Figure 4:
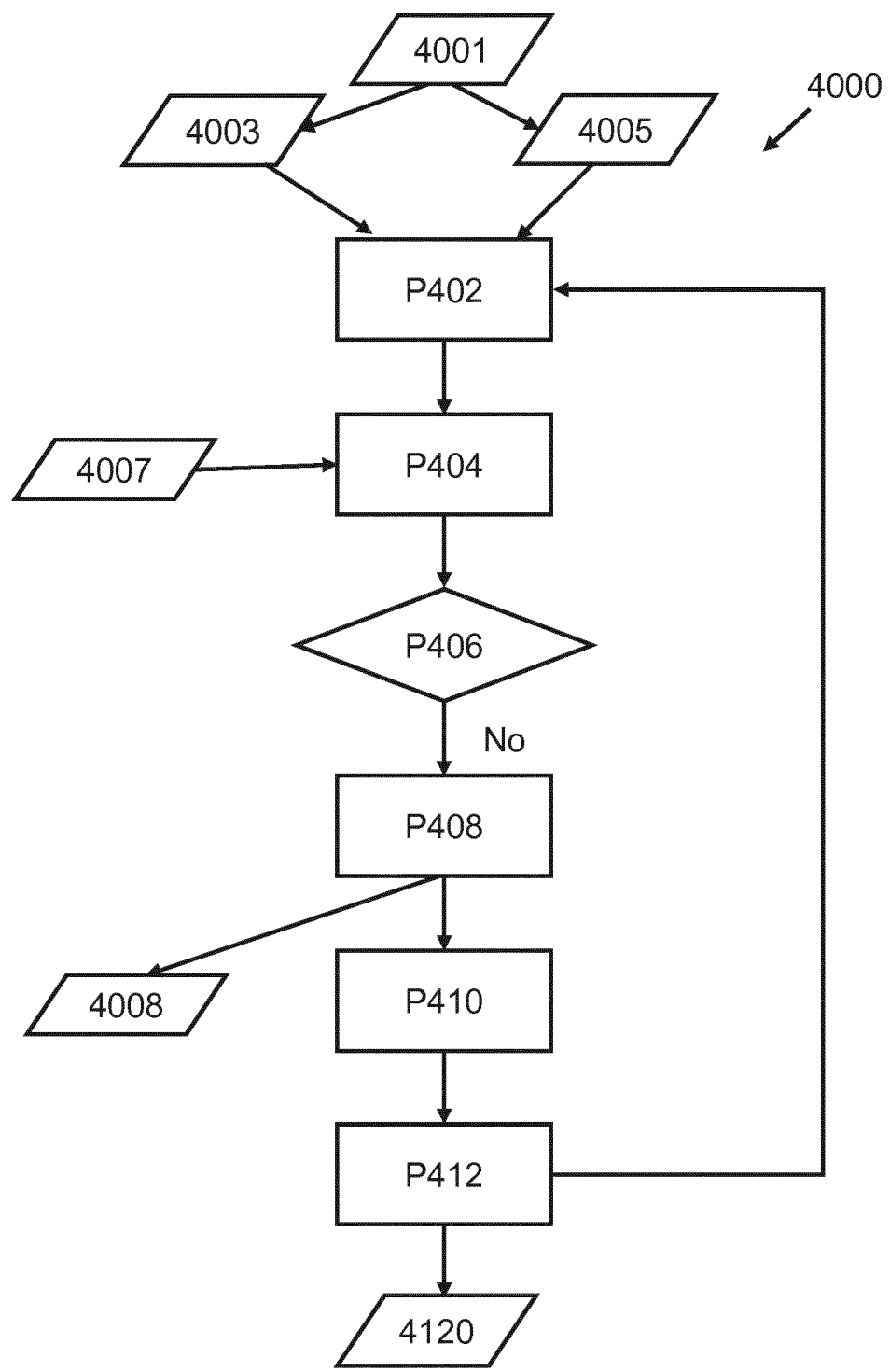
FIG. 4 is a method 4000 of hot spot ranking or re-ranking for a patterning process, according to an embodiment.

FIG. 4 is a method 4000 of hot spot ranking or re-ranking for a patterning process. The method of ranking is based on a measurement based feedback to correct or adjust simulation data (or models used in simulation of patterning process) related to hot spots. The measurement feedback is a measure used to compensate for inaccuracies of simulation that result in inaccurate ranking of hot spots. Such measurement feedback can effectively improve efficiency of the guided inspection so that more defects are captured (i.e., increased capture rate) and less time is spent inspection non-defect areas (i.e., low nuisance rate). Such measurement will lead to accurate prediction of real defects, and the measurement information/defect information can be further provided as input to a patterning process control system (e.g., via a scanner) to adjust the process parameters thereby reducing the number on wafer defects and improving yield.

In addition, metrology resources and time may be used more effectively based on the hot spot ranking. The measurement feedback may be determined in several ways such as based on a difference between measured data (e.g., defect data) from an exposed substrate and simulated data. For example, the defect data is related to parameters (e.g., CD, focus, dose, etc.) of the patterning process associated with the defects. Such measurement feedback allows to adjust a process model of the patterning process or results of simulation of the process model, thereby improving the accuracy of simulated data (e.g., values of parameters such as CD, focus, exposure, etc.) associated with the hot spots. Use of such adjusted data related to the hot spots results in accurate hot spot ranking compared to traditional methods that use only simulated data.

In the present disclosure, hot spots or hot spot patterns are used by way of example to explain the concepts and does not limit the scope of the present disclosure. The method may be applied to other pattern types such as a non-hot spot pattern or a user-defined pattern that may or may not cause a defect on the wafer. An example implementation of the method 4000 is discussed in detail as follows.

The method, in process P402, involves obtaining a set of hot spots 4001, simulated values 4003 (also referred as simulated data) of a parameter of the patterning process corresponding to the set of hot spots 4001, and an initial ranking 4005 (e.g., see plots 6000, 6010, and 9020 in FIGS. 6A, 6B and 9B, respectively) of one or more hot spots of the set of hot spots 4003.

In an embodiment, the set of hot spots 4001 may be obtained via simulation of the patterning process (e.g., discussed with respect to FIG. 18) and analyzing the simulation data with processing parameters (as discussed earlier) to identify locations with defects (e.g., see method of FIG. 3).

Process P402 further involves obtaining, via a metrology tool (e.g., FIGS. 11-16), defect data 4007 from an exposed wafer. In an embodiment, the exposed wafer may be measured using the metrology tools (e.g., SEM) and parameters of the patterning process may be extracted from the measurements. For example, contours of patterns may be extracted from an SEM image from the SEM and the contours may be checked against a desired contour or design specification. When the contours do not meet the design specification, the contour is flagged as a defect. In an embodiment, a defect metric based on the defect may be defined to quantify a characteristic (e.g., severity or criticality) of a hot spot and/or for ranking of the hot spots. In an embodiment, the defect metric is any metric related to a defective feature. In an embodiment, the defective feature is a feature that breaches (e.g., exceeds) a desired threshold value of a parameter of the patterning process (e.g., CD<30 nm or CD>30).

In an embodiment, a defect metric can be a defect size, a defect occurrence probability, a defect count or other defect related metric. A defect size may be defined as a value of a process parameter (e.g., CD) related to a defective feature or a difference between the value of the process parameter with respect to a threshold value. For example, a CD threshold for a bar may be 30 nm and the CD of the bar on the exposed wafer may be 25 nm, then the defect size may be 25 nm or a CD difference i.e., 5 nm. Accordingly, in an embodiment, the defect size related to a hot spot pattern may be used to determine a severity or criticality of the hot spot. In an embodiment, the greater the difference between the defect size and a threshold value, the higher the severity of the hot spot and vice versa. Similarly, a defect size may be defined for any parameter of the patterning process such as dose, focus, EPE, or other measurable parameters.

In an embodiment, the defect metric may be defect count defined as a total number of defect of a particular defect type (e.g., line pull back, hole closure, missing holes, etc.). For example, the total number of defect can be an integer number obtained from counting a particular type of defect.

In an embodiment, the defect metric may be a probability of defect occurrence. Such probability may be computed based on process variation of the patterning process or a weighted process variation (e.g., focus weighted process variation). Such probability based defect metric enables predictive capability to the simulation based defect analysis, where process models of the patterning process may be employed to determine a substrate image. Based on such defect predictions, process recipes (e.g., related to dose, focus, etc.) may be improved resulting in high yield. In addition, such prediction is faster and cost effective compared to collected metrology data from exposed wafer data and further extracting defect related information. The following description uses the defect size as an example metric to explain the concepts and does not limit the scope of the present disclosure. Any relevant defect metric may be employed for hot spot ranking.

In an embodiment, the initial ranking 4005 of the hot spots refers to a rank assigned to a hot spot within the set of hot spots 4001. In an embodiment, the initial ranking 4005 may be determined based on a ranking algorithm (e.g., see discussion with respect to FIGS. 10A and 10B) that determines a ranking, for example, based on a defect metric (e.g., a defect size). The ranking may be an integer scale from 1 to n, where n is number of total number hot spots. For example, based on the defect size, a high rank (e.g., 1) may assigned to a hot spot (or a hot spot pattern) having higher defect size and the ranking algorithm may gradually assign lower rank to other hot spots within 4001 as the defect size decreases. In an embodiment, the ranking may be based on the total number of defects or a probability of a defect corresponding to a hot spot being ranked. In an embodiment, the ranking algorithm (e.g., FIGS. 10A and 10B) may be part of the process model or a simulation of the patterning process, thereby the simulation result may be hot spot patterns along with their ranking.

Process P404 involves determining a correlation between the measured defect data 4007 and the initial hot spot ranking 4005, which is based on simulation data as discussed earlier. An example, correlation is shown in FIG. 9B. In an embodiment, a good correlation indicates that the hot spots are ranked accurately such that as the ranking of the hot spot decreases, the number of defects of that hot spot/pattern observed also decreases. However, because of the inaccuracies in the simulation of the process models, the initial ranking may not accurately correspond to the defect data. For example, in FIG. 6A, a hot spot ranked as 3 and 4 have zero defect occurrence on the wafer, while the hot spot ranked 10 has a higher occurrence (greater than zero) of defect on the wafer. In other words, ranking of 3, 4 and 10 is reversed or inaccurate. Thus, the plot indicates a poor correlation between the defect data 4007 and the initial ranking 4005.

In an embodiment, the correlation may be expressed in terms of a percentage or a statistical parameter indicating the correlation level. The correlation level may be compared to a threshold value to determine whether the correlation is good or poor. For example, process P406 involves determining whether the correlation breaches a threshold value (e.g., less than 50% correlation).

Responsive to breaching of the threshold, process P408 involves determining a measurement feedback 4008 based on the simulated values 4003 and the defect data 4007. In an embodiment, determining the measurement feedback 4008 involves obtaining measured values of the parameter corresponding to the defect data, and determining the measurement feedback 4008 based on a difference between the measured values and the simulated values of the parameter (e.g., CD, dose, focus, etc.). For example, CD can be defined as a function of dose and focus. In an embodiment, the measurement feedback 4008 may be a maximum value of the difference, an average value or a difference between two functions (e.g., 8001 and 8002 discussed with respect to FIG. 8).

In an embodiment, the measurement feedback 4008 is a maximum value of the difference between the measured values and the simulated values.

In another embodiment, determining the measurement feedback 4008 involves grouping one or more hot spots of the set of hot spots 4001 based on a pattern type or simulated values 4003 of the parameters of the patterning process, and determining an average measurement feedback per hot spot group. For example, grouping is based on similar geometries that will also result in similar printed patterns. For example, a pattern type refers to patterns having similar geometric contour/shape, and/or size. For example, rectangular patterns may be grouped into a first group and a circular shaped patterns may be grouped in a second group, rectangular patterns of certain dimension may be grouped in a third group, a circular pattern with certain dimension may be grouped in a fourth group and so on. In an embodiment, a group may be interchangeably referred as category. In an embodiment, the group or category may be based on values of the parameters of the patterning process, for example, CD values or geometric shapes. For example, patterns having a first similar CD values may be a first group, patterns having a second similar CD values may be a second group, patterns having a third similar CD values may be a third group, and so on may be used to categorize a hot spot.

Process P410 involves adjusting the simulated values 4003 of defect data to include the measurement feedback 4008. In an embodiment, the simulated values 4003 are adjusted based on an average measurement feedback per hot spot group. For example, the measurement feedback may be a difference between measured CD values and the simulated CD values, and the difference may be used to adjust (i.e., increase or decrease) the simulated CD values.

Figure 10A:
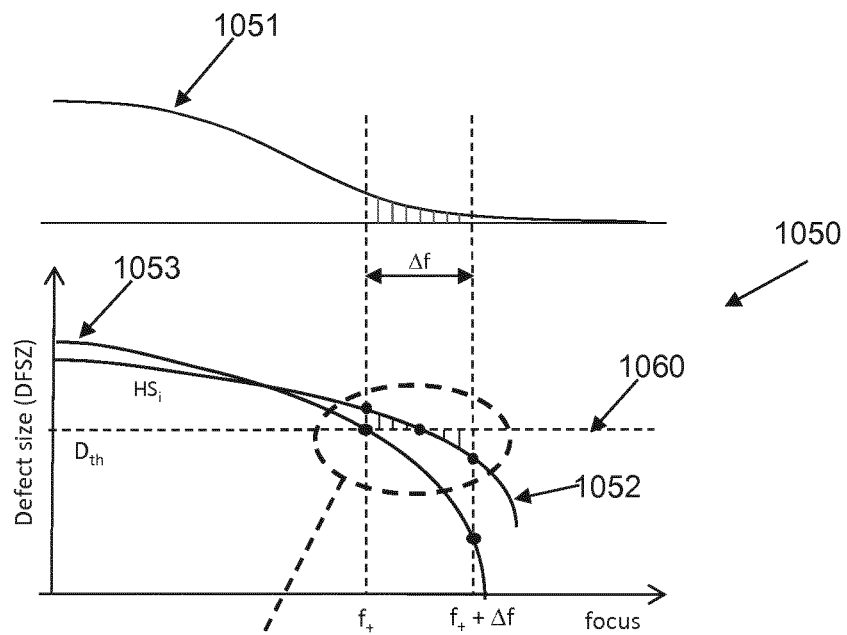
FIGS. 10A and 10B show an example of a ranking algorithm for determining a ranking of hot spots, according to an embodiment.
Figure 10B:
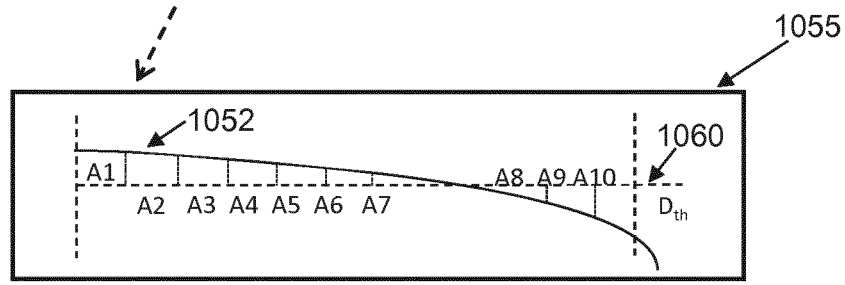

Process P412 involves determining, via simulation of a ranking algorithm, a ranking of the set of hot spot patterns based on the adjusted values of the parameter of the patterning process. In an embodiment, the ranking is based on focus-exposure matrix behavior (e.g., characterized by a Bossung curve) of each hot spot. An example ranking is illustrated in FIGS. 10A and 10B.

Figure 6A:
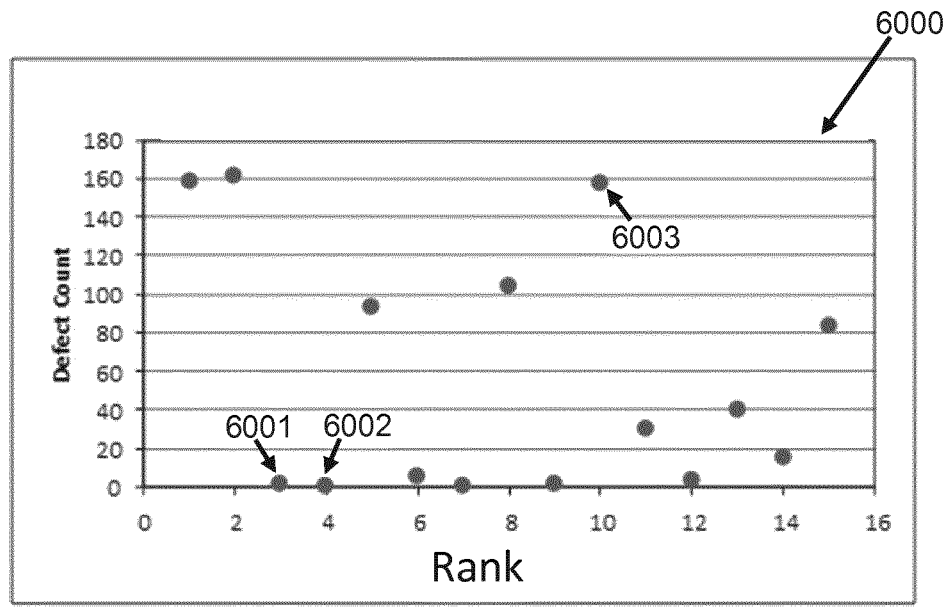
FIGS. 6A and 6B are plots illustrating an initial ranking of hot spots for a first wafer and a second wafer, respectively, according to an embodiment.
Figure 6B:
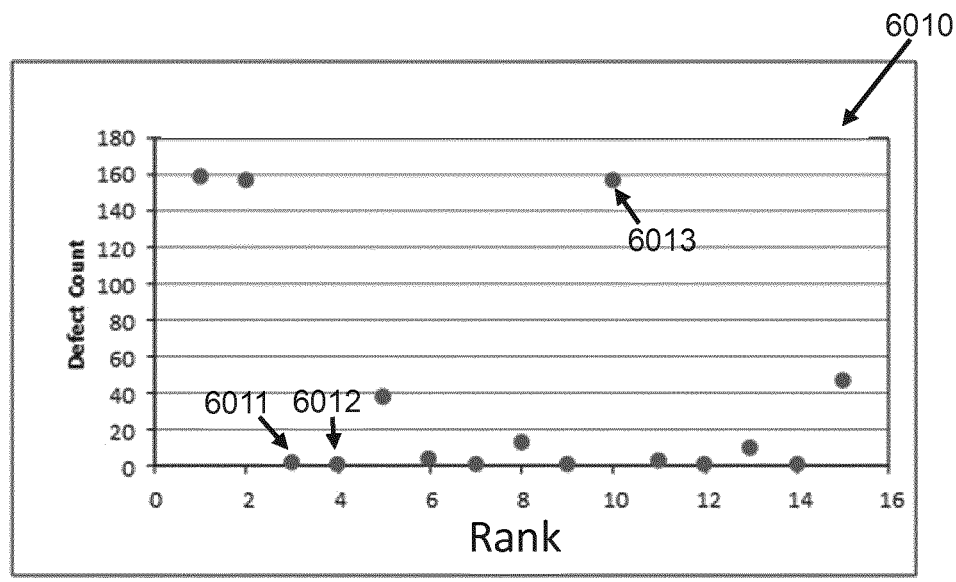

FIGS. 6A and 6B are plots 6000 and 6010 of an example initial ranking of the hot spots based on defect count for a first wafer and a second wafer, respectively. An accurate ranking indicates that high rank hot spots have higher defect counts compared to low rank hot spots. As shown, the initial ranking of hot spots for the first wafer are inaccurate. For example, high ranked (e.g., 3 and 4) hot spots 6001 (or 6011) and 6002 (or 6012) do not occur as defects on the first wafer; while the low ranked (e.g., 11) hot spot 6003 (or 6013) results in higher number of defects.

Figure 7A:
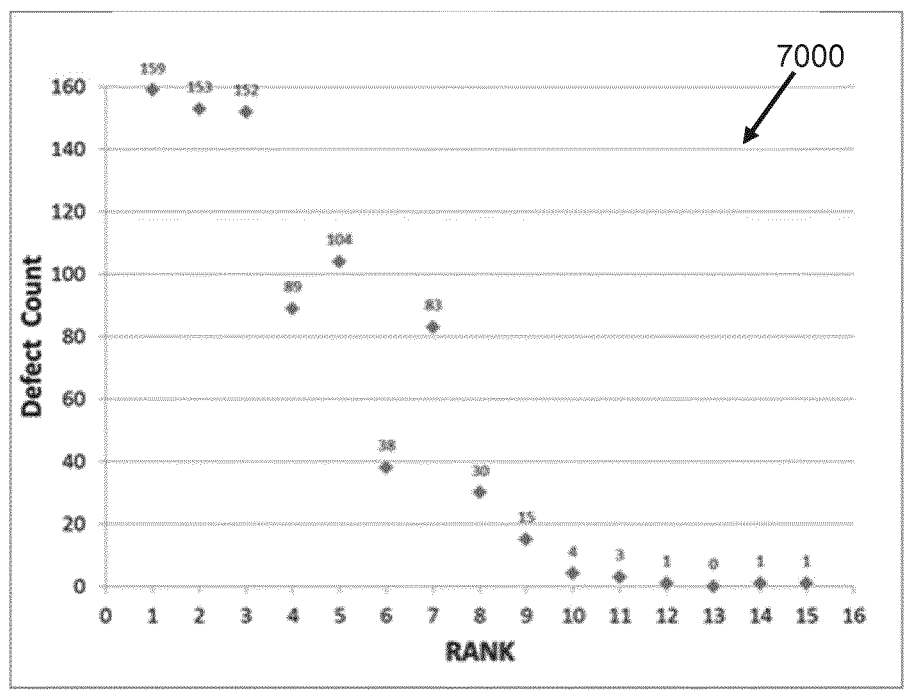
FIGS. 7A and 7B are plots illustrating a ranking (or re-ranking of FIGS. 6A and 6B) of hot spots based on the methods of FIG. 4 or 5A/5B/5C for the first wafer and the second wafer, respectively, according to an embodiment.
Figure 7B:
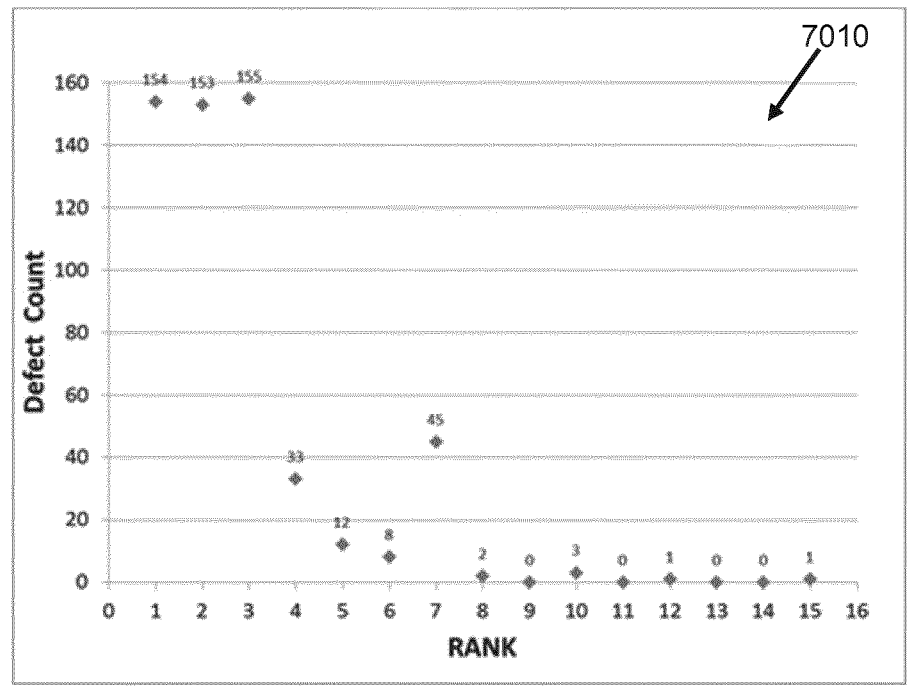

After applying the measurement feedback (e.g., of methods 4000 and 5000), a more accurate ranking is obtained. For example, FIGS. 7A and 7B are plots 7000 and 7010 of an example ranking of the hot spots. As shown, the ranking of hot spots are more accurate than in FIGS. 6A and 6B. For example, high ranked (e.g., 3 and 4) hot spots occur with higher number of defects; while the low ranked (e.g., 11) hot spots show less number of defects compared to the high ranked hot spots.

Figure 9A:
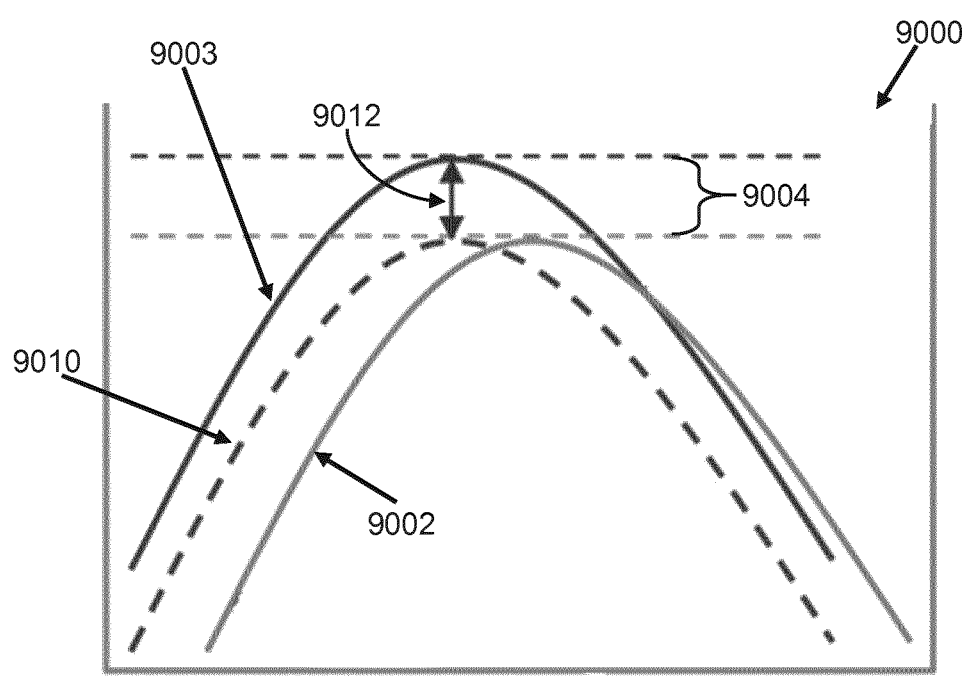
FIG. 9A is an example of measurement feedback, according to an embodiment.
Figure 9B:
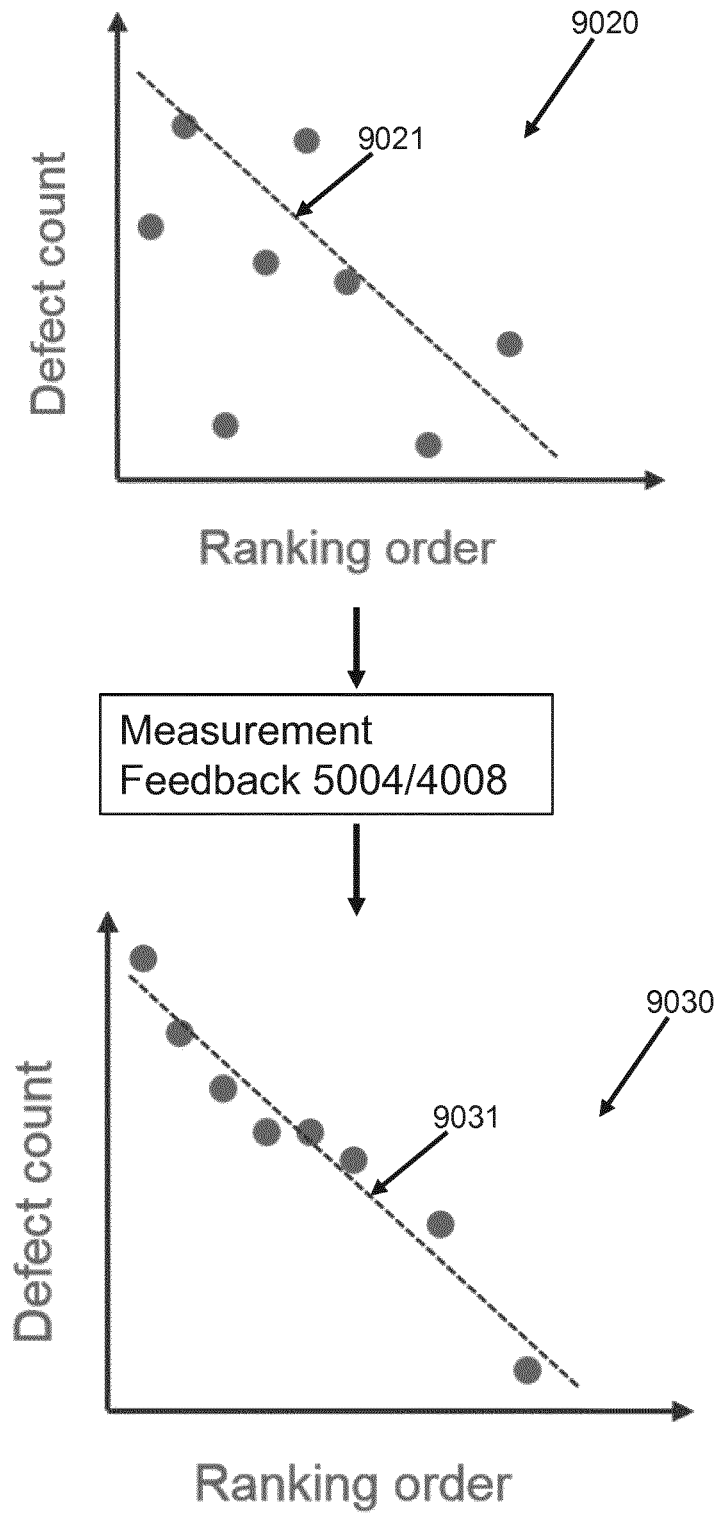
FIG. 9B shows an example illustrating how a correlation between an ranking and defect count changes based on the measurement feedback of FIG. 9A, according to an embodiment.

FIG. 9A is an example of the measurement feedback (e.g., 4008 or 5004). In an embodiment, the measurement feedback may be based Bossung curve. The Bossung curve may be defined as a function between patterning result (e.g., the CD values) and parameters of the patterning process such as dose and focus (also referred as focus-exposure matrix).

In an embodiment, the Bossung curve plotted using measured values 9002 of CD, dose and focus corresponding to patterns on an exposed wafer. In an embodiment, the measured values 9002 may be obtained via metrology tool (e.g., optical tool within a lithographic apparatus or a SEM tool). In an embodiment, the Bossung curve may be represented as a second function 9002 between CD, dose and focus. As shown, the first function 9003 and the second function 9002 may not be the same. In other words, the simulated values 9003 may be not match the measured values 9003 of the patterning process due to inaccuracies in simulated process models and approximations within the simulation process.

In an embodiment, the Bossung curve is obtained via simulation of computational lithography models (e.g., Tachyon software) that simulates the patterning process. In an embodiment, the simulated values 9003 (e.g., CD) associated with simulated wafer patterns and corresponding dose/focus values may be expressed as a mathematical function (e.g., a first function 9003), stored in a look-up table and/or stored a database.

Based on the simulation results and the measured values, the measurement feedback may be determined as a difference 9004 between the measured values 9002 and the simulated values 9003. In an embodiment, the difference 9004 may be a difference between maximum values of simulated CD and measured CD. In embodiment, the difference may be a mathematical function i.e., difference between the first function (e.g., based on simulated CD values 9002) and the second function (e.g., based on measured CD values 9002).

In an embodiment, the measurement feedback 9004 is further used to adjust (e.g., in process P410) the simulated values 9003 (or the first function) resulting in adjusted values 9010 (or a function). In an embodiment, the adjustment may involves subtracting the difference 9004 (e.g., between maximum values) from the simulated values so that the simulated values 9003 closely follow the measured values 9002 of the patterning process. When such adjusted values 9010 (or a function) is used for ranking hot spots, more accurate ranking of the hot spots is achieved. When additional measurements are to be made on a printed wafer, a metrology tool may be guided to higher ranked hot spot locations, according to an embodiment. Thus, such guided metrology will capture data related to hot spots with higher probability of defects, thereby improving the quality of data captured. Thus, for a given metrology cost (e.g., related to time and resource used to measure), higher quality of data may be obtained. Such data may be further used to improve the patterning process effectively improving the yield.

Figure 8:
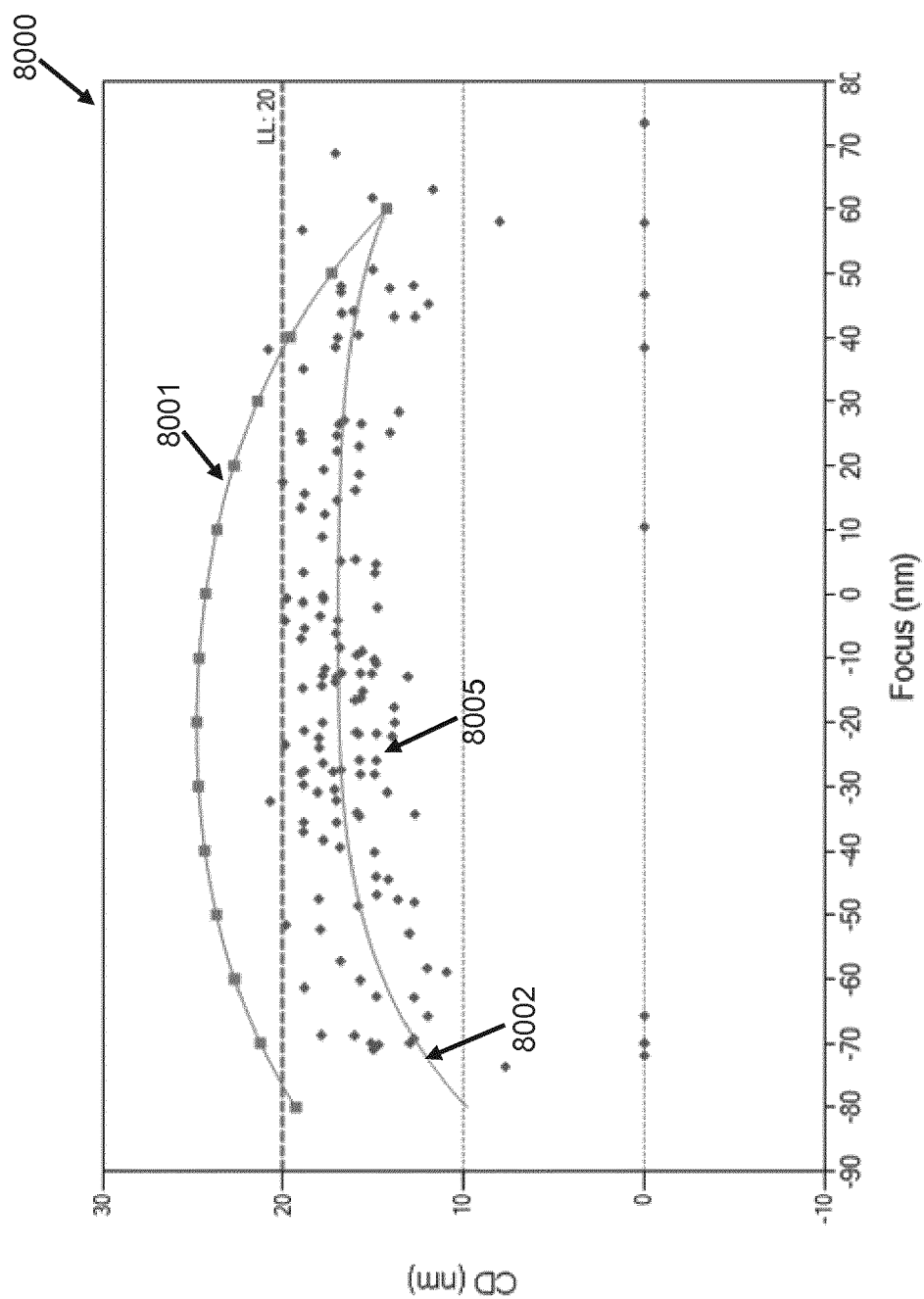
FIG. 8 is an example Bossung plot based on simulated values and measured values of parameters of the patterning process, according to an embodiment.

FIG. 8 is an example Bossung plot based on simulated values 8001 (an example of 4003 and 5003) and measured values (an example of 4010 and 5004) of the parameters of the patterning process (e.g., CD and focus). The plot shows that the simulated CD values 8001 and the measured CD values 8005 are offset from each other. In other words, there is a bias between the simulated CD values 8001 and the measured CD values 8005. As discussed earlier, a bias may be determined by taking a difference between the simulated values and the measured values. Based on the bias, a measurement feedback may be determined. In an embodiment, such measurement feedback may be a maximum difference value. In an embodiment, the measurement feedback may be a function.

In an embodiment, the simulated values 8001 may be used to determining a first function, for example, by regression-based fitting means such as based on mean squared error. Similarly, a second function may be fitted to represent the measured values 8005. Then, a difference between the first function and the second function may result in a bias function. The bias function may be further used to adjust the simulated values (e.g., as discussed in FIGS. 4, 5 and 9A) and further determine the ranking of the hot spots.

It can be understood that the first function and the second function are not limited to a mathematical relationship between CD and focus values. In an embodiment, the functions may be based on other measurable parameters of the patterning process such as EPE, dose, focus, defects, etc. Also, the present disclosure is not limited to a fitting method and any method such as regression based statistical approach that minimizes an error (e.g., RMS, or higher order errors) may be used for data fitting.

FIG. 9B shows an example plot 9020 illustrating a correlation between an initial ranking (e.g., 4005) and defect metric (e.g., defect count) before applying the measurement feedback. In FIG. 9A, the ranking (along x-axis) of the hot spot exhibit poor correlation with defect count (along y-axis). In other words, the ranking do not show, for example, a linear relationship (e.g., correlation level 9021) with the defect count such that the ranking gradually decreases with the defect count. So, a poor correlation may be measured in terms of a distance between a data point and the correlation level 9021, where closer (e.g., less distance) the data points to the correlation level (e.g., 9021), better the correlation. However, the initial ranking in 9020 involves hot spots having low rank but high defect count and vice versa. Thus, the initial ranking is not accurate and valuable resources may be wasted in measuring hot spots that are not representative of the patterning process.

However, when the measurement feedback (e.g., 4008 and 5004), as discussed with respect to FIG. 9A, is applied and a final ranking is calculated (e.g., as discussed with FIGS. 10A and 10B), an improved ranking of the hot spots is obtained. For example, the plot 9030 illustrates that a correlation between the ranking and the defect count is improved compared to that shown in 9020. In other words, the final ranking shows, for example, a linear relationship (e.g., a correlation level 9030) such that the defect count (y-axis in 9030) gradually decreases as the ranking (x-axis in 9030) gradually decreases. The correlation level 9020 and 9030 are example linear relationships and serve as reference to determine a quality of correlation. The present disclosure is not limited to a linear correlation between the ranking order and the defect count. For example, any other type of correlation such as representing an exponentially decreasing function may exist, and the type of correlation does not limit the scope of the present disclosure.

FIGS. 10A and 10B show an example of a ranking algorithm for determining a ranking of the hot spots. In an embodiment, the example ranking algorithm is based on Bossung plot 1050 that defines the relationship between a defect size and a parameter of the patterning process. For example, the ranking is based on a relationship between the defect size (e.g., CD values or CD difference with respect to a threshold) and the focus values. The defect relationship depends on the type of pattern (e.g., different hot spots). Accordingly, different hot spots may exhibit different defect behavior with respect to a change in the focus values. In an embodiment, as the focus increases (e.g., left to right along the x-axis of plot 1050) the defect size decreases (e.g., see 1052 or 1053). For example, for a first hot spot, a first relationship 1052 may indicate an inverse of probability of a defect occurrence as the focus values change. Similarly, for a second hot spot, the second relationship 1053 may indicate an inverse of probability of a defect occurrence as the focus values change. In an embodiment, the second relationship 1053 may corresponding to a maximum limiting condition for a process window. In other words, the second hot spot impose constraints on outer limits of, for example, CD values and corresponding dose/focus values. Such second hot spot may result in highest probability of defect and thus ranked highest.

Typically during the wafer manufacturing, the focus values vary resulting in a variation in the CD printed on the wafer. Thus, in an embodiment, a probability distribution 1051 of a focus value may be used to define a range within which a defect size may be computed for a particular hot spot. In an embodiment, the probability distribution 1051 may be a Gaussian distribution, i.e., a normalized distribution, within a selected range. In an embodiment, the selected range may correspond to a positive focus range defined as boundary values f+ and f++Δf; where f+ is a lower limit and f++Δf is an upper limit. Then, the ranking algorithm may determine the defect size within the selected positive focus range (e.g., 1055). For example, based on the relationship (e.g., 1052 or 1053), the defect size may be computed within the focus range 1055.

As mentioned earlier, in an embodiment, the ranking may be computed based on a defect size with respect to a defect threshold (e.g., minimum allowable CD limit). In an embodiment, the defect threshold may be based on a desired yield (e.g., 99.9%). For example, the defect size may be computed about the defect threshold 1060, as illustrated in FIG. 10B.

In an embodiment, a defect size of a hot spot may be defined as a sum of the product of focus value probability and a difference between defect occurrence for a hot spot and the defect threshold. For example, the defect size may be computed based on following equations:

$$\Delta DFSZi = \sum j(\text{focus value probability})j\left(DFSZij - Dth\right)$$
$$= A1 \times W1 + A2 \times W2 + \ldots + A10 \times W10$$

Where, $\Delta DFSZi$ is an expected defect size for an i-th hot spot Hi that is most likely to print in focus uncertainty range; $DFSZij$ is a defect size for i-th hot spot at j-th focus value, and Dth is the defect threshold. Further, as illustrated in FIG. 10B, values A1-A10 may be a difference between the defect relationship (e.g., 1052) and the defect threshold, and W1-W10 may be probability of focus values computed from, for example a normalized focus values within the selected focus range. In an example, A1-A7>0, A8-A10<0, and W1>W2>W3 . . . >W10.

Based on the above equations, defect size for one or more hot spots of a set of hot spots (e.g., 4001 or 5001) may be determined. Further, a hot spot having highest defect size may be assigned a highest rank (e.g., rank 1). For example, the second hot spot (corresponding to 1053) may be assigned rank 1, the first hot spot may be assigned a rank 2, a third hot spot may be assigned a rank 3, and so on. According to an embodiment, the ranking is dependent on accuracy of the defect relationship (e.g., 1052 and 1053) and focus values. As such, if the relationship changes, the ranking will change. In an embodiment, the adjusted values (e.g., from method 4000 or 5000) of the focus and/or defect relationship based on the measurement feedback (e.g., 4008 or 5004) may result in accurate ranking of the hot spots. For example, in an embodiment, the Bossung curve may be adjusted based on a bias function (e.g., FIG. 9A), which may effectively affect the ranking of the hot spots.

Figure 5A:
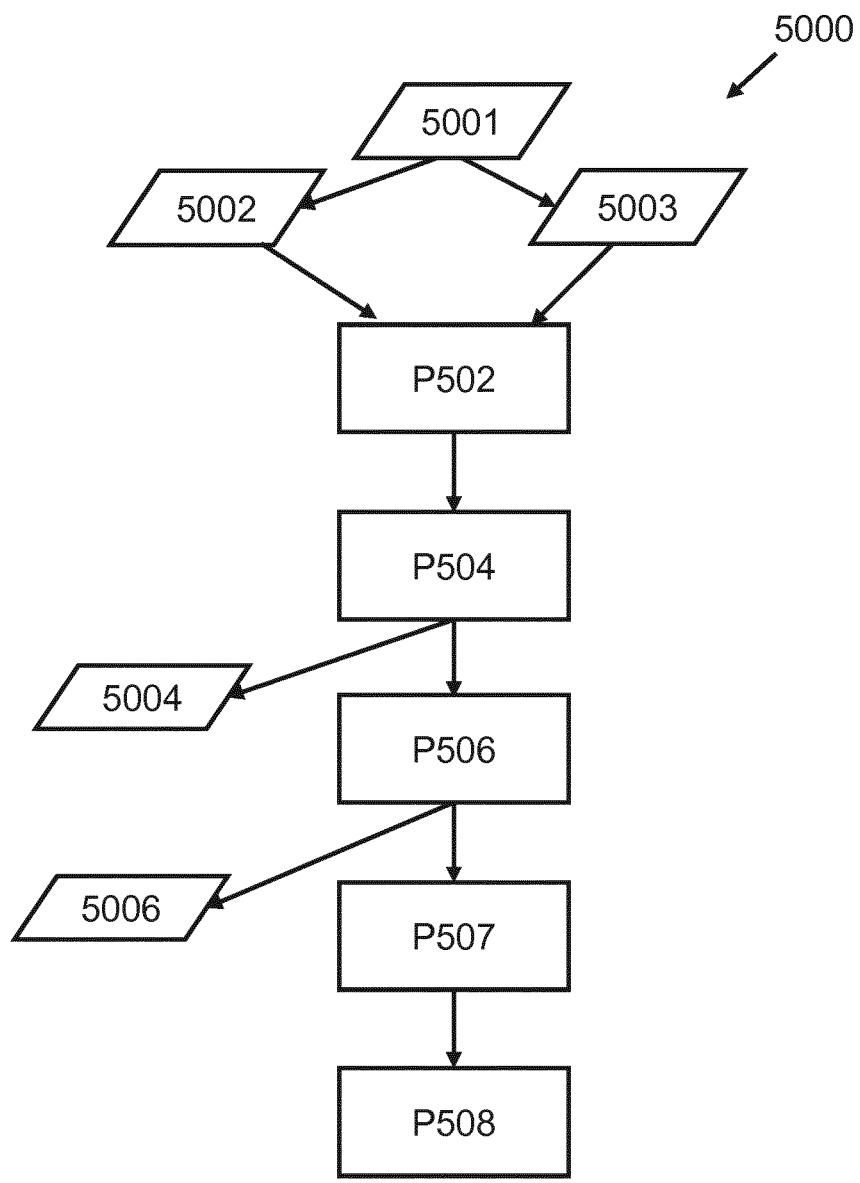
FIGS. 5A, 5B and 5C are flowcharts for another implementation of a method for determining hot spot ranking, according to an embodiment.
Figure 5B:
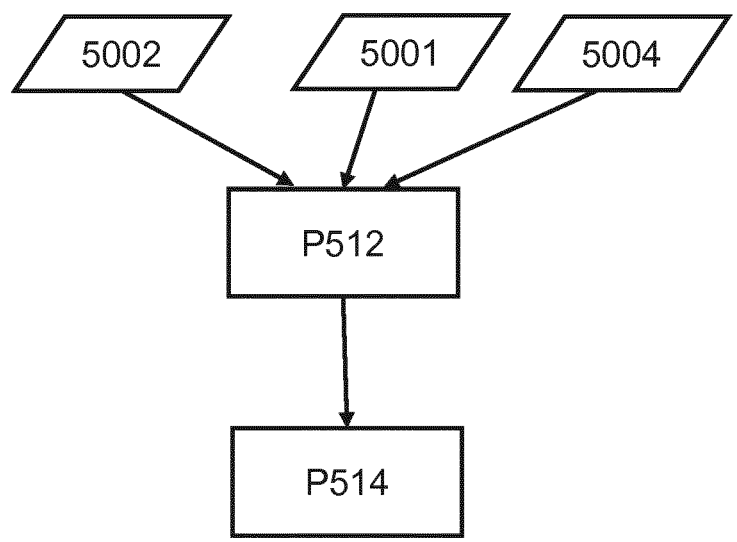
Figure 5C:
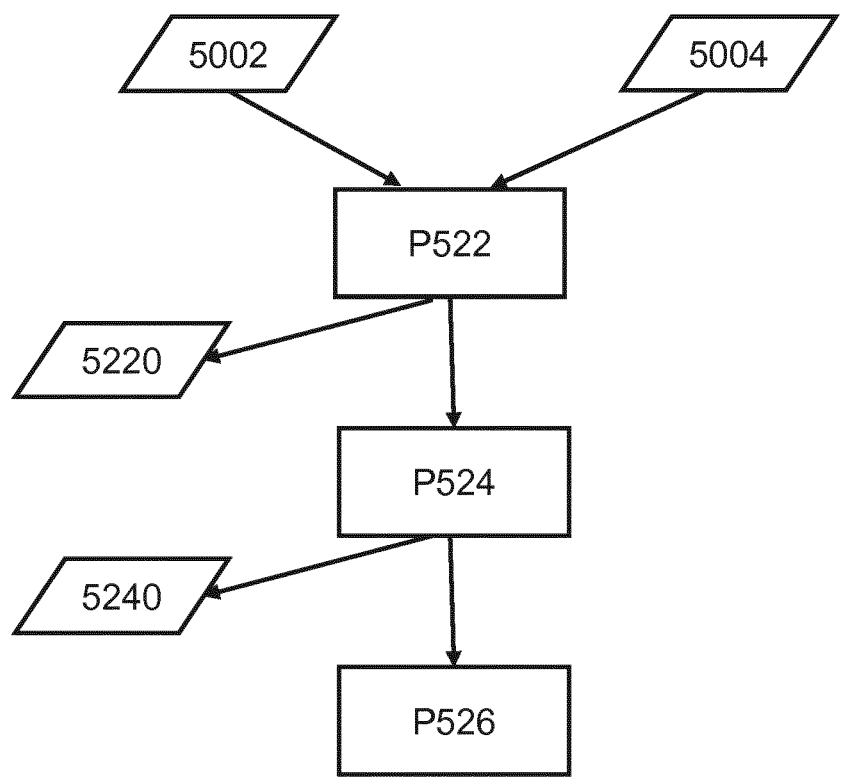

FIGS. 5A, 5B and 5C are flowcharts for another implementation of a method for determining hot spot ranking. The method 5000 determines a set of hot spots based on a measurement feedback, which is determined based on measured values of the parameters of the patterning process. As mentioned earlier, the measurement feedback may be determined in several ways such as based on a difference between measured data (e.g., defect data) from an exposed substrate and simulated data. Further, a metrology tool may be guided to relevant locations on the substrate that have higher likelihood of defect occurrences compared to other locations on the substrate. For example, locations may correspond to hot spots with high rank. For example, hot spots having a high rank (e.g., 1, or 2).

In an embodiment, the method (e.g., in process P502) involves obtaining (i) a set of hot spots 5001 of a patterning process, (ii) measured values of parameters 5002 of the patterning process corresponding to the set of hot spots, and (ii) simulated values of the parameters 5002 of the patterning process corresponding to the set of hot spots. The set of hot spots 5001, the measured values 5002 and the simulated values are similar to 4001, 4003 and 4010, respectively, as discussed earlier in method 4000. Further, the method 5000 (e.g., in process P504) involves determining, via a processor (e.g., processor 104 of FIG. 19), a measurement feedback based on the measured values and the simulated values of the parameters of the patterning process. Once the measurement feedback is determined, the method (e.g., in process P506) further involves determining, via simulation of a process model of the patterning process using the measurement feedback, a ranking of a hot spot within a set of hot spots. In an embodiment, the set of hot spots may be similar to the set of hot spots 5001, except with a different ranking.

Process P502 involves obtaining (i) a set of hot spots of a patterning process, (ii) measured values of parameters of the patterning process corresponding to the set of hot spots, and (ii) simulated values of the parameters of the patterning process corresponding to the set of hot spots.

Process P504 involves determining, via a process (e.g., process 104), a measurement feedback 5004 based on the measured values 5002 and the simulated values 5003 of the parameters of the patterning process. The measurement feedback may be determined in a similar manner as discussed earlier in process P408 of FIG. 4. For example, in an embodiment, the measurement feedback 5004 is a maximum value (e.g., 9004 in FIG. 9A) of a difference between the measured values and the simulated values. In another embodiment, the measurement feedback 5004 is an average value of a difference between the measured values and the simulated values corresponding to a category of the hot spot within the set of the hot spots. In yet another embodiment, the measurement feedback 5004 is a bias function (e.g., FIG. 8) determined as a difference between a first function (e.g., 8002) representing the measured values and a second function (e.g., 8001) representing the simulated values. In an embodiment, the process P504 involves determining the measurement feedback 5004 based on a bias function, as discussed with respect to FIG. 5B.

In FIG. 5B, process P512 involves categorizing hot spots within the set of hot spots in one or more categories. As discussed earlier (in process P408), the category is based on a pattern type (e.g., geometric shapes) and/or a values of focus-exposure-matrix (e.g., dose/focus values). In an embodiment, the pattern type is determined based on geometric shapes and/or sizes (e.g., square, rectangle, circle, etc.) of the features within the hot spot. In an embodiment, the geometric shapes may be extracted from an image via image processing such as in pattern fidelity matching, where contours of a pattern (e.g., simulated or measured such as SEM image) are extracted and compared to a design layout. Thus, patterning of similar shapes and sizes may be grouped together and an average values per group of pattern may be determined. Similarly, in an embodiment, values of the focus-exposure matrix including a critical dimension, a dose, and/or a focus may be used for categorizing and further determining average values.

In an embodiment, process P514 involves determining the bias function for a particular category of the hot spot based on the measured values of the parameters of the patterning process and the simulated values of the parameters of the patterning process. In an embodiment, the determining the bias function further includes process P522, P524 and P526 (shown in FIG. 5C).

Process P522 involves determining the first function fitting the measured values. For example, the first function 8001 as discussed with respect to FIG. 8 earlier. Process P524 involves determining the second function corresponding to the process model of the patterning process used to generate the simulated values. For example, the second function 8002 as discussed with respect to FIG. 8 earlier. Once the functions are determined, process P526 involves determining the difference between the first function and the second function. As discussed earlier, the first function and/or the second function is a mathematical model and/or a look up table. For example, the first function may be a mathematical function such as CD=f(dose, exposure). The second function may store the measured values of the CD, dose, focus in a database as a look-up table.

In an embodiment, the determining the measurement feedback is an iterative process (similar to that discussed in method 4000). An iteration involves obtaining defect data corresponding to the set of hot spots, determining a correlation between the defect data and hot spot ranking, evaluating a level of the correlation; and responsive to the level of correlation breaching a threshold, determining the measurement feedback.

Once the measurement feedback 5004 is determined, the method 5000 of FIG. 5A, involves determining, via simulation of a process model of the patterning process, a ranking of a hot spot within a set of hot spots, generated by the simulation, based on the measurement feedback. An example ranking process based on Bossung curve of different hot spots (e.g., 1052 and 1053) is illustrated discussed with respect to FIGS. 10A and 10B.

In an embodiment, the determining the ranking of the hot spot includes determining the category of one or more hot spots of the set of hot spots, applying the bias function corresponding to the category to generate a biased version of the one or more hot spot, and determining, via simulation of a ranking algorithm (e.g., FIGS. 10A and 10B) of the process model of the patterning process, the ranking of the biased hot spot. For example, the category of the hot spot may be contact holes (e.g., holes of 12 nm-14 nm in size), then a bias function corresponding to the contact holes may be determined (e.g., as shown in FIG. 8). Further, Bossung curve corresponding to contact holes may be determined (e.g., via simulation). Then, the Bossung curve may be adjusted (or biased) with the biased function of the contact hole. Such Bossung curve may be referred as a biased hot spots. A biased hot spot may refer to any values related to the hot spot, where the values are adjusted based on the biased function. For example, the biased hot spot may refer to values of CD, focus, dose, etc.

In an embodiment, the ranking algorithm (e.g., as discussed in FIGS. 10A and 10B) includes determining a probability of a defect occurrence corresponding to each of the hot spot within the set of hot spot. In an embodiment, the probability is evaluated within a focus uncertainty range (e.g., 1055 in FIG. 10B). In an embodiment, the probability of the defect occurrence is a weighted sum of a difference between a defect size and a threshold defect size ($D_{th}$) at different focus values within the focus uncertainty range.

The ranking of the hot spots may be further used in different aspects of the patterning process. For example, the method, in process P507 involves guiding, via a processor (e.g., 104), an inspection tool to collect measurement data on a printed substrate according to the ranking of the hot spots. In an embodiment, the guiding an inspection tool (e.g., FIG. 11 or 16) involves generating signals configured to identify a location on a printed substrate based on the ranking of the hot spots.

In an embodiment, process P508 involves determining, via a processor (e.g., 104), defects on the printed substrate based on the measurement data. For example, the measurements (e.g., SEM image) collected at the high ranked hot spots (e.g., in P507) may be further process to identify defects, for example, contours/CD values that do not satisfy design specification.

An embodiment of the present method discussed above (e.g., in FIGS. 4 and 5A-5C) implementing different steps/processes of the method is presented by way of example and does not limit the scope of the present disclosure. It can be understood by a person skilled in the art the steps discussed below may be executed in sequence (e.g., on the processor 104) or in parallel (on one or more processors 104/105). For example, in an embodiment, an output of a certain process may be generated on a first processor (e.g., 104) and the output may be received as input by another process executed on a second processor.

Figure 11:
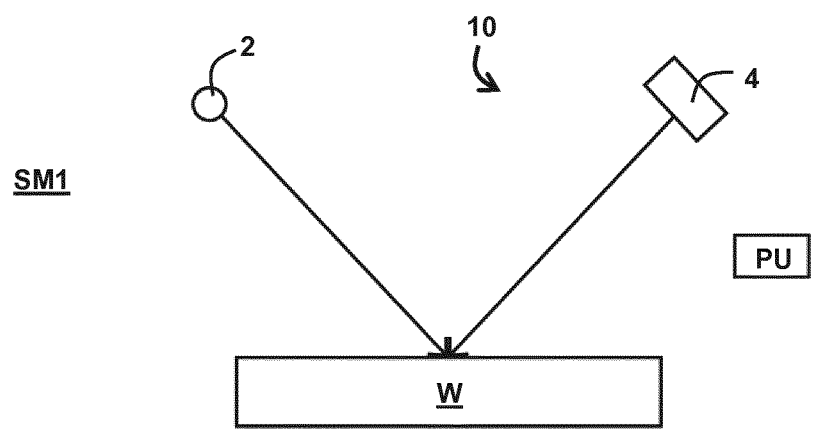
FIG. 11 schematically depicts an example inspection apparatus and metrology technique, according to an embodiment.
Figure 11:
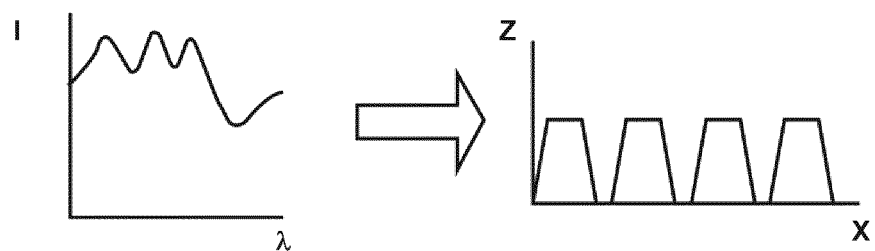

FIG. 11 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 11. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 12:
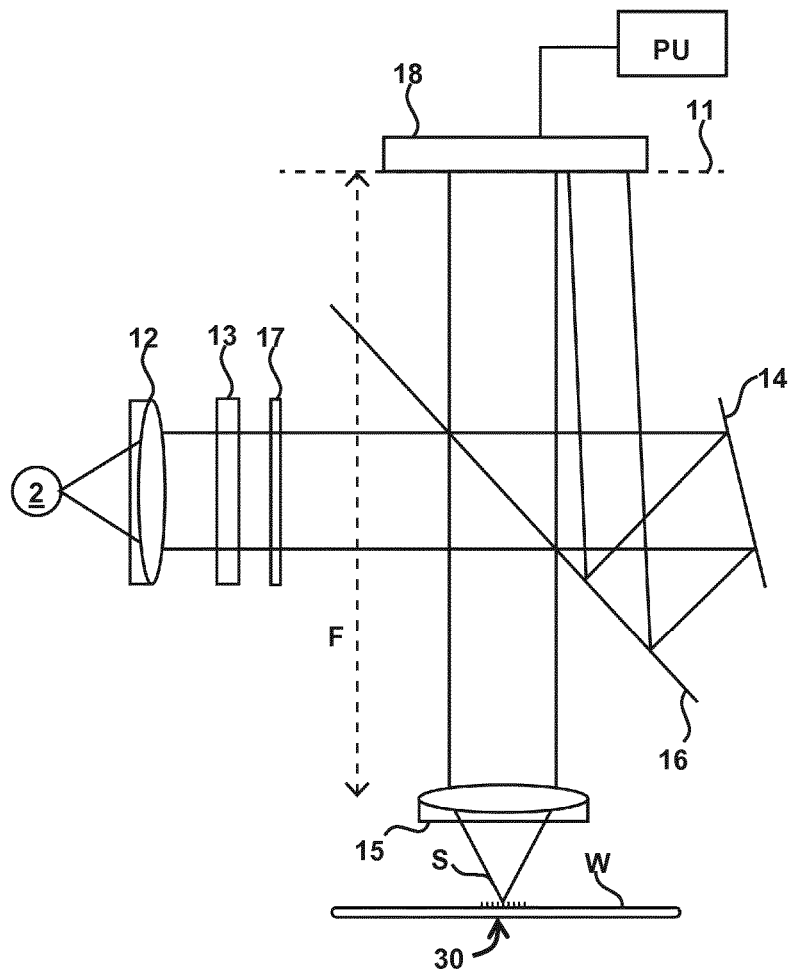
FIG. 12 schematically depicts an example inspection apparatus, according to an embodiment.

Another inspection apparatus that may be used is shown in FIG. 12. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 11 or FIG. 12 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 12, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 13:
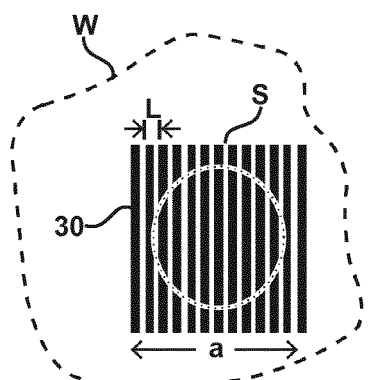
FIG. 13 illustrates the relationship between an illumination spot of an inspection apparatus and a metrology target, according to an embodiment.

FIG. 13 illustrates a plan view of a typical target 30, and the extent of illumination spot S in the apparatus of FIG. 12. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 14:
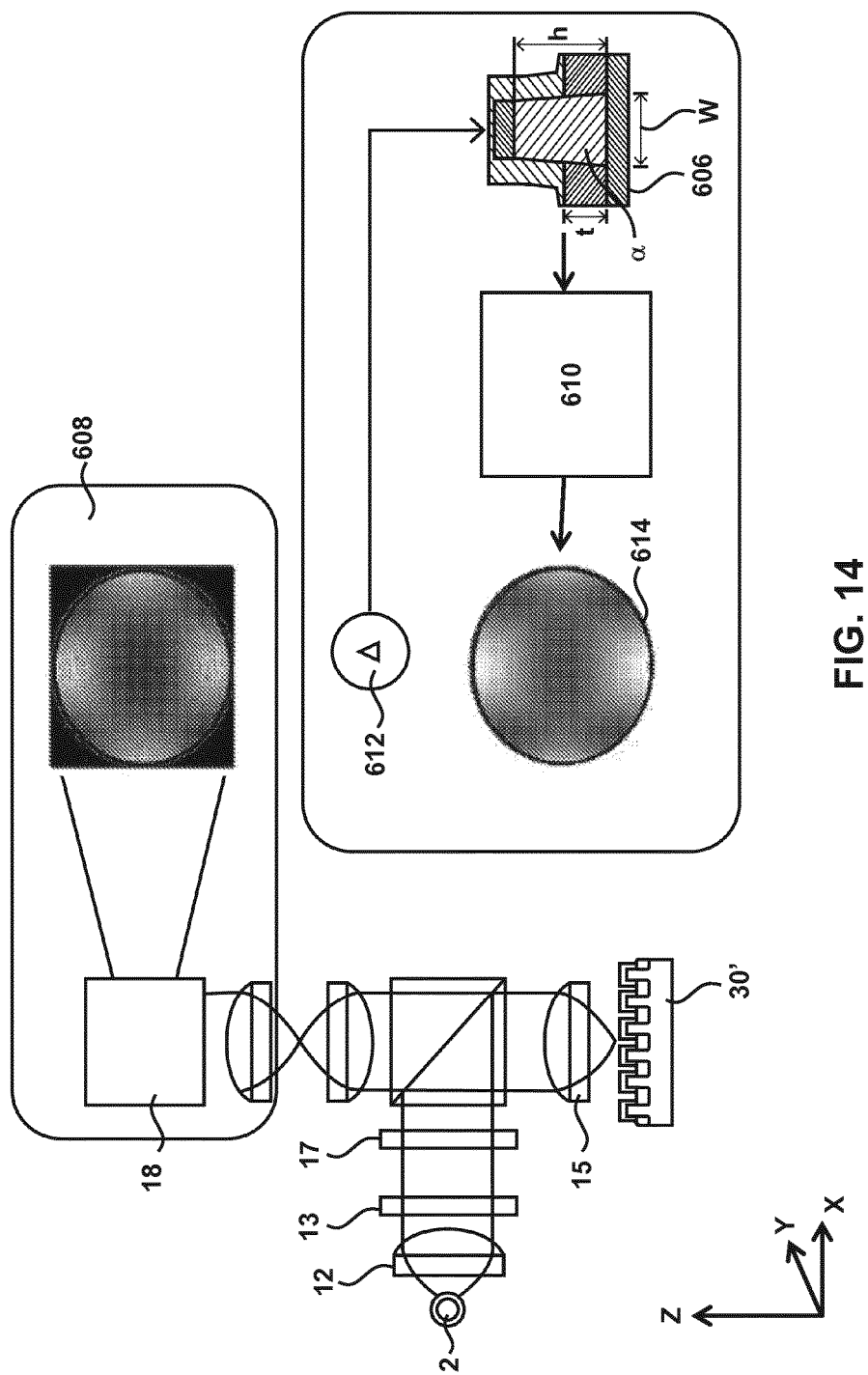
FIG. 14 schematically depicts a process of deriving a plurality of variables of interest based on measurement data, according to an embodiment.

FIG. 14 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 14, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 15:
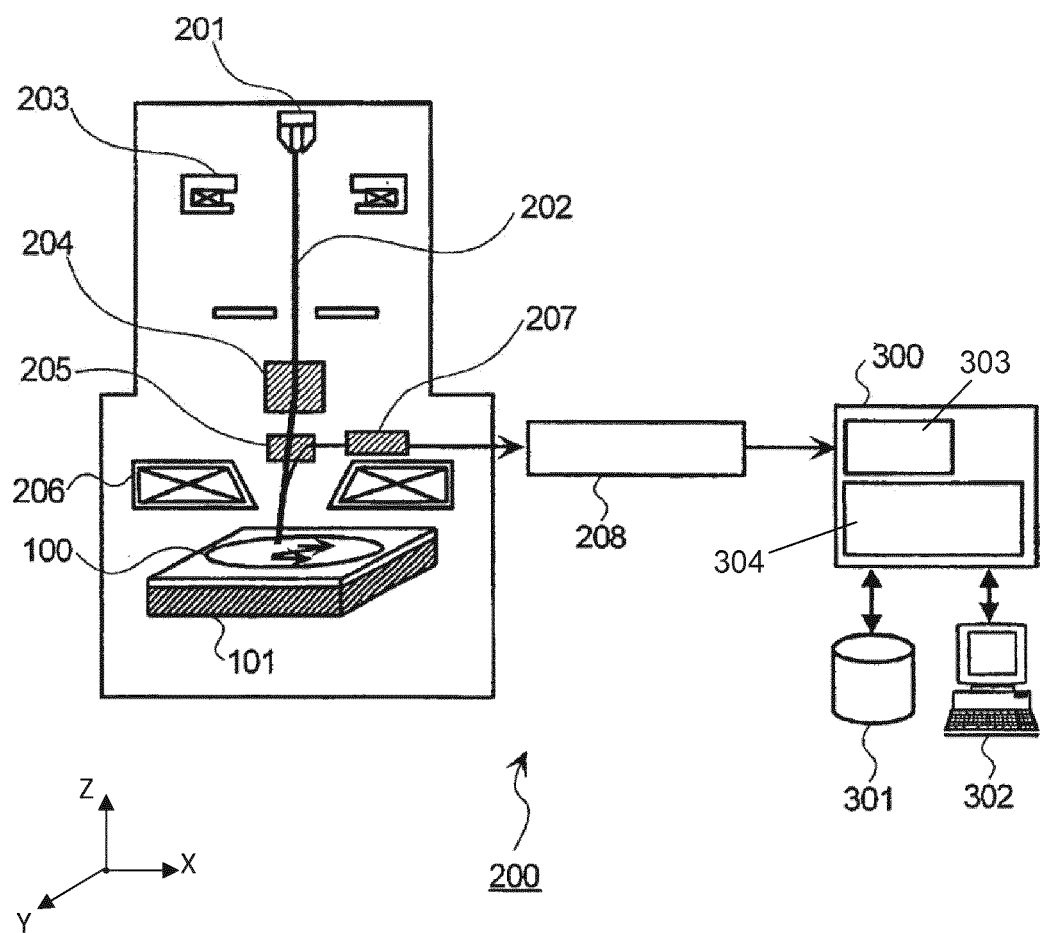
FIG. 15 schematically depicts an embodiment of a scanning electron microscope (SEM), according to an embodiment.

FIG. 15 schematically depicts an embodiment of an electron beam inspection apparatus 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 16:
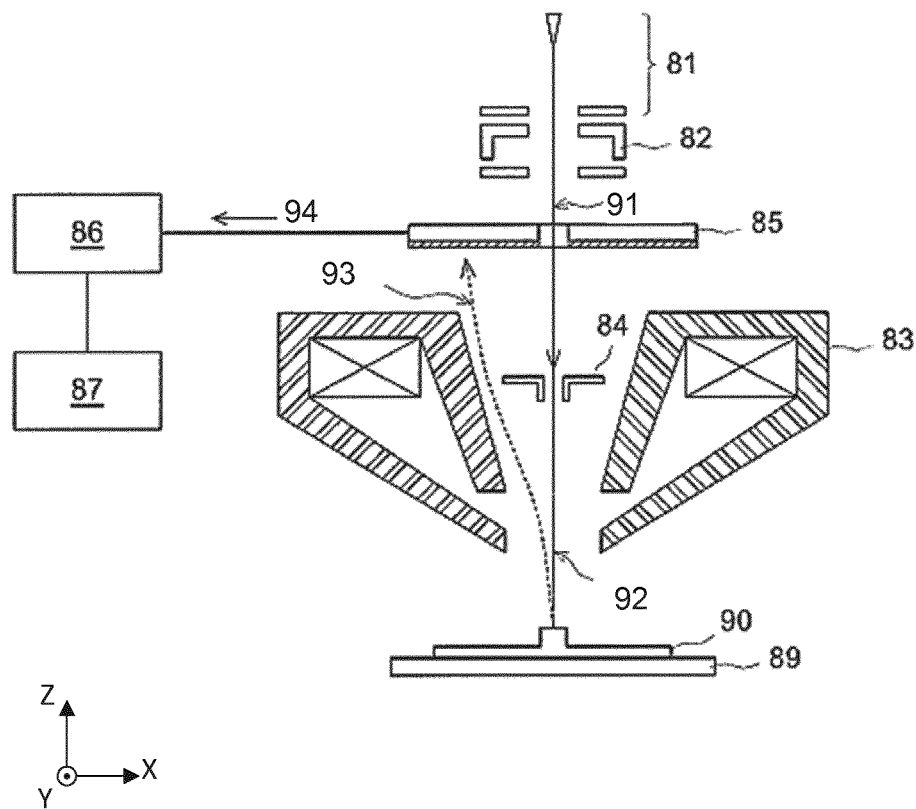
FIG. 16 schematically depicts an embodiment of an electron beam inspection apparatus, according to an embodiment.

FIG. 16 schematically illustrates a further embodiment of an inspection apparatus. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 15 that uses a probe to inspect a substrate, the electron current in the system of FIG. 16 is significantly larger compared to, e.g., a CD SEM such as depicted in FIG. 15, such that the probe spot is large enough so that the inspection speed can be fast. However, the resolution may not be as high as compared to a CD SEM because of the large probe spot. In an embodiment, the above discussed inspection apparatus (in FIGS. 7 and 8) may be single beam or a multi-beam apparatus without limiting the scope of the present disclosure.

The SEM images, from, e.g., the system of FIG. 15 and/or FIG. 16, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Figure 17:
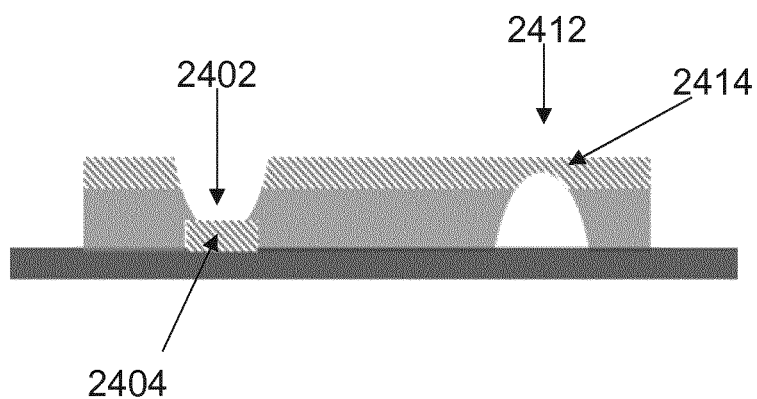
FIG. 17 illustrates example defects on a printed substrate, according to an embodiment.

FIG. 17 illustrates example defects such as a footing 2402 and necking 2412 type of failure may be observed for certain setting of the process variable such as dose/focus. In case of footing, de-scumming may be performed to remove a foot 2404 at the substrate. In case of the necking 2412, a resist thickness may be reduced by removing a top layer 2414. In an embodiment, another ranking criteria may be whether the defects resulting from some hot spots are fixable or not via a post-patterning process. For example, hot spots that lead to defects that may be fixed post-patterning process and occur less frequently than other defects may be ranked substantially lower.

Figure 18:
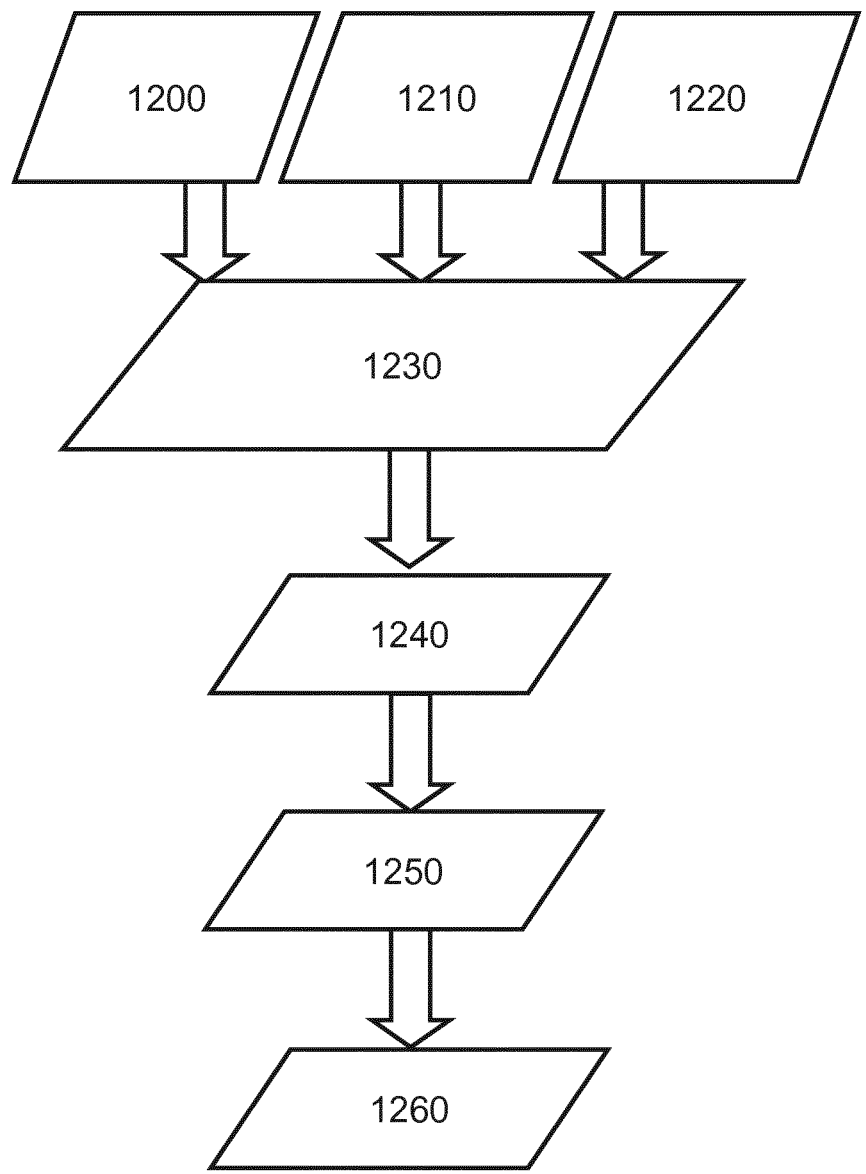
FIG. 18 depicts an example flow chart for modeling and/or simulating at least part of a patterning process, according to an embodiment.

An exemplary flow chart for modelling and/or simulating parts of a patterning process is illustrated in FIG. 18. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where 6 (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

As discussed above, the present disclosure provides a method of hot spot ranking for a patterning process according to an embodiment. The method includes obtaining (i) a set of hot spots of a patterning process, (ii) measured values of parameters of the patterning process corresponding to the set of hot spots, and (ii) simulated values of the parameters of the patterning process corresponding to the set of hot spots; determining, via a hardware computer system, a measurement feedback based on the measured values and the simulated values of the parameters of the patterning process; and determining, via simulation of a process model of the patterning process, a ranking of a hot spot within the set of hot spots, generated by the simulation, based on the measurement feedback.

In an embodiment, the measurement feedback is a bias function determined as a difference between a first function representing the measured values and a second function representing the simulated values.

In an embodiment, the determining the measurement feedback includes categorizing hot spots within the set of hot spots in one or more categories; and determining the bias function for a particular category of the hot spot based on the measured values of the parameters of the patterning process and the simulated values of the parameters of the patterning process.

In an embodiment, the determining the bias function includes determining the first function fitting the measured values; determining the second function corresponding to the process model of the patterning process used to generate the simulated values; and determining the difference between the first function and the second function.

In an embodiment, the first function and/or the second function is a mathematical model and/or a look up table.

In an embodiment, the measurement feedback is a maximum value of a difference between the measured values and the simulated values.

In an embodiment, the measurement feedback is an average value of a difference between the measured values and the simulated values corresponding to a category of the hot spot within the set of the hot spots.

In an embodiment, the determining the ranking of the hot spot includes determining the category of one or more hot spots of the set of hot spots; applying the bias function corresponding to the category to generate a biased version of the one or more hot spot; and determining, via simulation of a ranking algorithm of the process model of the patterning process, the ranking of the biased hot spot.

In an embodiment, the ranking algorithm includes determining a defect metric corresponding to each of the hot spot within the set of hot spot, wherein the defect metric is evaluated within a focus uncertainty range.

In an embodiment, the defect metric is a weighted sum of a difference between a defect size and a threshold defect size at different focus values within the focus uncertainty range.

In an embodiment, the method further includes guiding, via the hardware computer system, an inspection tool to collect measurement data on a printed substrate according to the ranking of the hot spots; and determining, via the hardware computer system, defects on the printed substrate based on the measurement data.

In an embodiment, the determining the measurement feedback is an iterative process, an iteration includes obtaining defect data corresponding to the set of hot spots; determining a correlation between the defect data and hot spot ranking; evaluating a level of the correlation; and responsive to the level of correlation breaching a threshold, determining the measurement feedback.

In an embodiment, the category is based on a pattern type and/or values of parameters of the patterning process.

In an embodiment, the pattern type is determined based on geometric shapes of the features within the hot spot.

In an embodiment, the parameters of the patterning process includes a critical dimension, a dose, and/or a focus.

Furthermore, in an embodiment there is provided a method of hot spot ranking for a patterning process. The method includes obtaining (i) a set of hot spots, (ii) simulated values of a parameter of the patterning process corresponding to the set of hot spots, and (iii) an initial ranking of one or more hot spots of the set of hot spots; obtaining, via a metrology tool, defect data from an exposed wafer; determining a correlation between the defect data and the initial hot spot ranking; determining whether the correlation breaches a threshold value; responsive to breaching of a threshold, determining a measurement feedback based on the simulated values and the defect data; adjusting the simulated values of the parameter of the patterning process to include the measurement feedback; and determining, via simulation of a ranking algorithm, a ranking of the set of hot spot patterns based on the adjusted values of the parameter of the patterning process.

In an embodiment, the measurement feedback includes obtaining, via the metrology tool, measured values of the parameter corresponding to the defect data; and determining the measurement feedback based on a difference between the measured values and the simulated values.

In an embodiment, determining the measurement feedback includes grouping one or more hot spots of the set of hot spots based on a pattern type or values of parameters of the patterning process; and determining an average measurement feedback per hot spot group.

In an embodiment, the simulated values are adjusted based on the average measurement feedback per hot spot group.

In an embodiment, the parameters of the patterning process includes focus and/or exposure.

In an embodiment, the measurement feedback is a maximum value of the difference between the measured values and the simulated values.

Figure 19:
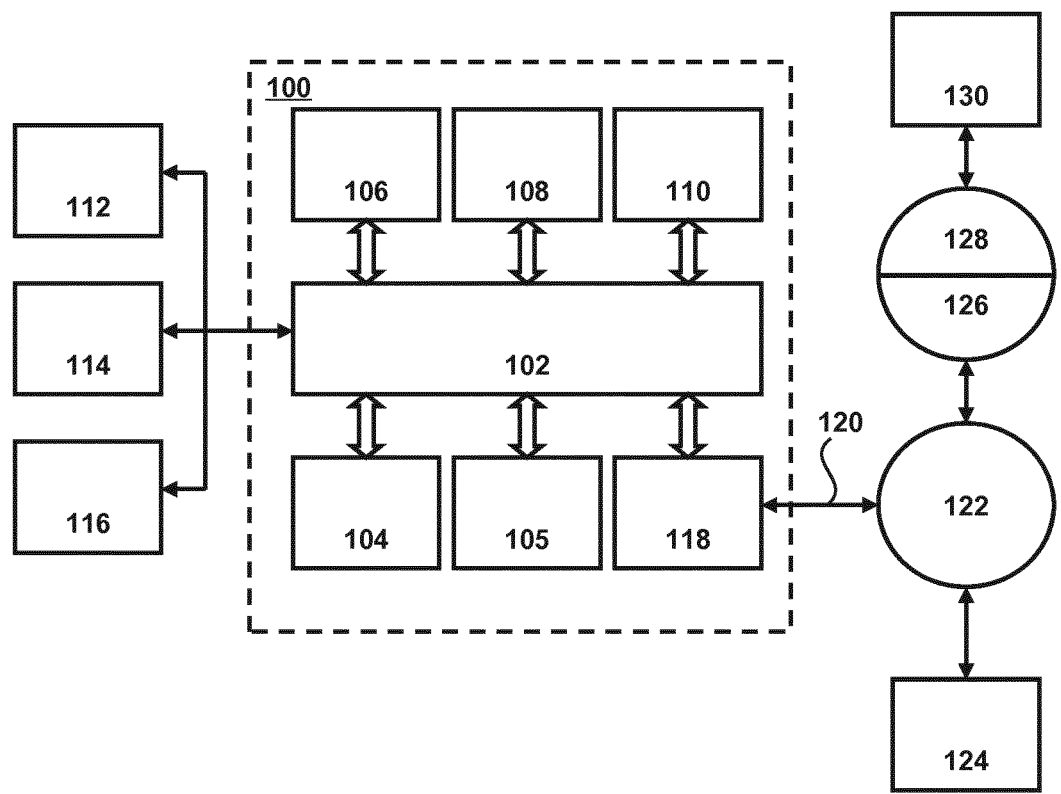
FIG. 19 is a block diagram of an example computer system, according to an embodiment.

FIG. 19 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 20:
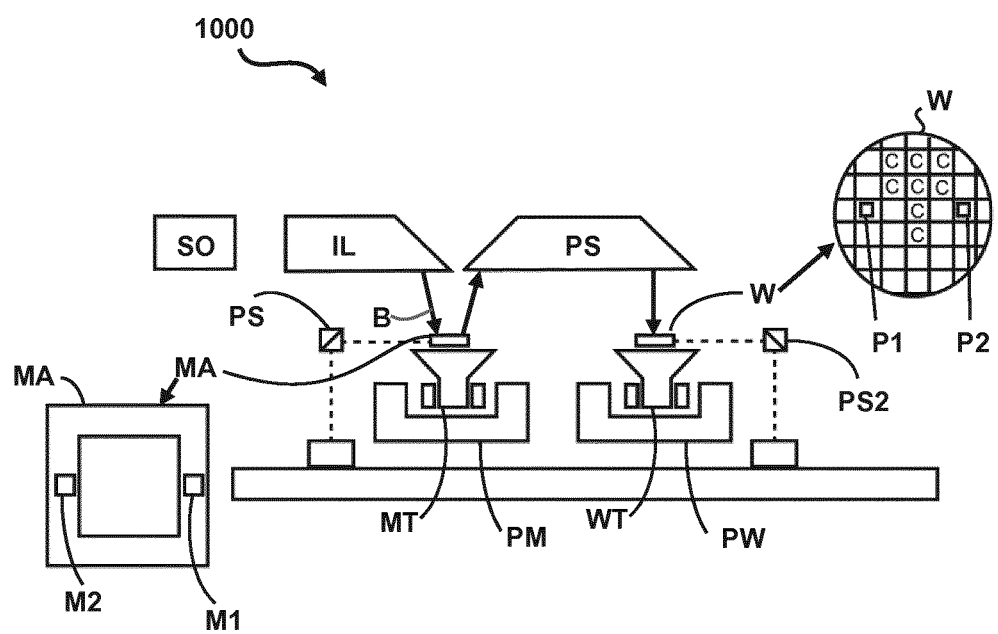
FIG. 20 is a schematic diagram of an extreme ultraviolet (EUV) lithographic projection apparatus, according to an embodiment.

FIG. 20 schematically depicts another exemplary lithographic projection apparatus 1000 that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 20, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 20, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:
1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 21:
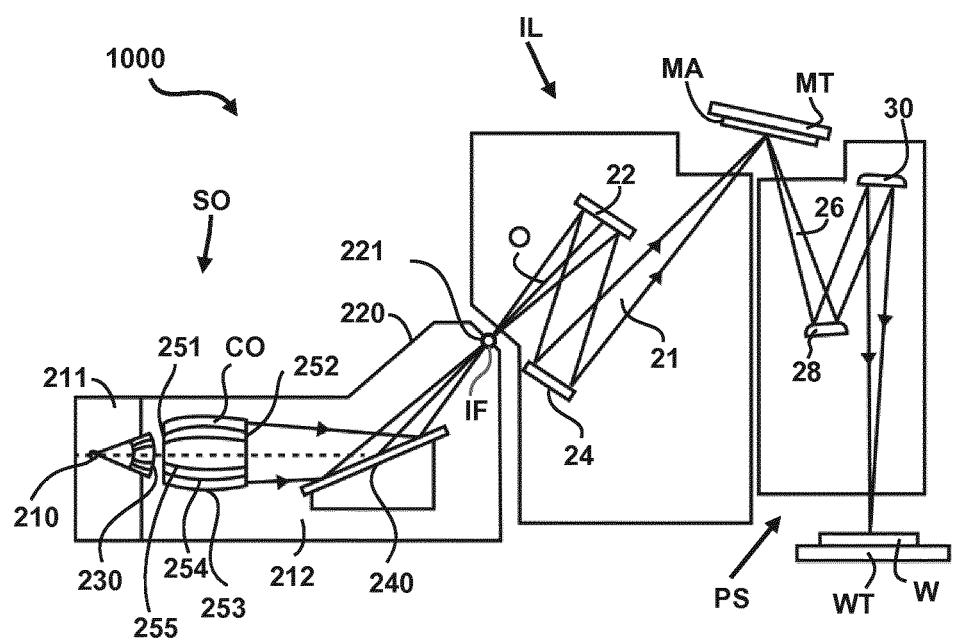
FIG. 21 is a more detailed view of the apparatus in FIG. 20, according to an embodiment.

FIG. 21 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 21.

Collector optic CO, as illustrated in FIG. 21, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 22:
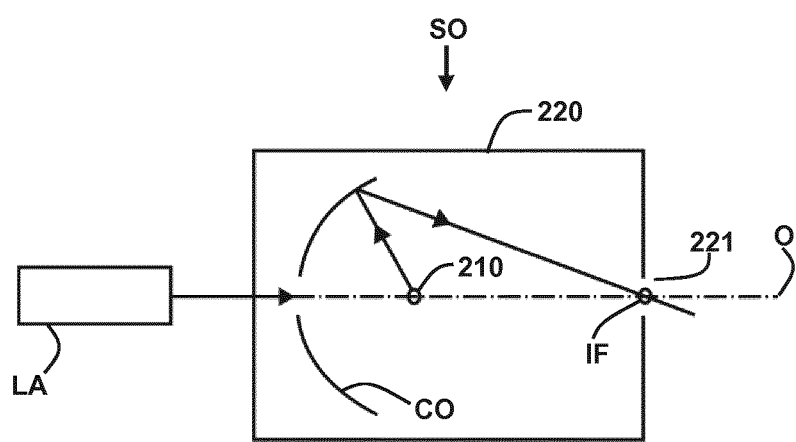
FIG. 22 is a more detailed view of the source collector module of the apparatus of FIG. 20 and FIG. 21, according to an embodiment.

Alternatively, the source collector module SO may be part of an LPP radiation system as shown in FIG. 22. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of hot spot ranking for a patterning process, the method comprising:
   obtaining (i) a set of hot spots of a patterning process, (ii) measured values of parameters of the patterning process corresponding to the set of hot spots, and (ii) simulated values of the parameters of the patterning process corresponding to the set of hot spots;
   determining, via a hardware computer system, a measurement feedback based on the measured values and the simulated values of the parameters of the patterning process; and
   determining, via simulation of a process model of the patterning process, a ranking of a hot spot within the set of hot spots, generated by the simulation, based on the measurement feedback.

2. The method of clause 1, wherein the measurement feedback is a bias function determined as a difference between a first function representing the measured values and a second function representing the simulated values.

3. The method of clause 2, wherein the determining the measurement feedback comprises: categorizing hot spots within the set of hot spots in one or more categories; and determining the bias function for a particular category of the hot spot based on the measured values of the parameters of the patterning process and the simulated values of the parameters of the patterning process.

4. The method of clause 3, wherein the determining the bias function comprises:
   determining the first function fitting the measured values;
   determining the second function corresponding to the process model of the patterning process used to generate the simulated values; and
   determining the difference between the first function and the second function.

5. The method of clause 4, wherein the first function and/or the second function is a mathematical model and/or a look up table.

6. The method of any of clauses 1-5, wherein the measurement feedback is a maximum value of a difference between the measured values and the simulated values.

7. The method of any of clauses 1-5, wherein the measurement feedback is an average value of a difference between the measured values and the simulated values corresponding to a category of the hot spot within the set of the hot spots.

8. The method of any of clauses 1-5, wherein the determining the ranking of the hot spot comprises:
   determining the category of one or more hot spots of the set of hot spots;
   applying the bias function corresponding to the category to generate a biased version of the one or more hot spot; and
   determining, via simulation of a ranking algorithm of the process model of the patterning process, the ranking of the biased hot spot.

9. The method of clause 8, wherein the ranking algorithm includes determining a defect metric corresponding to each of the hot spot within the set of hot spot, wherein the defect metric is evaluated within a focus uncertainty range.

10. The method of clause 9, wherein the defect metric is a weighted sum of a difference between a defect size and a threshold defect size at different focus values within the focus uncertainty range.

11. The method of any of clauses 1-10, further comprising:
    guiding, via the hardware computer system, an inspection tool to collect measurement data on a printed substrate according to the ranking of the hot spots; and
    determining, via the hardware computer system, defects on the printed substrate based on the measurement data.

12. The method of any of clauses 1-10, the determining the measurement feedback is an iterative process, an iteration comprising:
    obtaining defect data corresponding to the set of hot spots;
    determining a correlation between the defect data and hot spot ranking;
    evaluating a level of the correlation; and
    responsive to the level of correlation breaching a threshold, determining the measurement feedback.

13. The method of any of clauses 2-12, wherein the category is based on a pattern type and/or values of parameters of the patterning process.

14. The method of clause 13, wherein the pattern type is determined based on geometric shapes of the features within the hot spot.

15. The method of clause 13, wherein the parameters of the patterning process includes a critical dimension, a dose, and/or a focus.

16. A method of hot spot ranking for a patterning process, the method comprising:
    obtaining (i) a set of hot spots, (ii) simulated values of a parameter of the patterning process corresponding to the set of hot spots, and (iii) an initial ranking of one or more hot spots of the set of hot spots;
    obtaining, via a metrology tool, defect data from an exposed wafer;
    determining a correlation between the defect data and the initial hot spot ranking;
    determining whether the correlation breaches a threshold value;
    responsive to breaching of a threshold, determining a measurement feedback based on the simulated values and the defect data;
    adjusting the simulated values of the parameter of the patterning process to include the measurement feedback; and
    determining, via simulation of a ranking algorithm, a ranking of the set of hot spot patterns based on the adjusted values of the parameter of the patterning process.

17. The method of clause 16, wherein the measurement feedback comprises:
    obtaining, via the metrology tool, measured values of the parameter corresponding to the defect data; and
    determining the measurement feedback based on a difference between the measured values and the simulated values.

18. The method of any of clauses 16-17, wherein determining the measurement feedback comprises:

grouping one or more hot spots of the set of hot spots based on a pattern type or values of parameters of the patterning process; and determining an average measurement feedback per hot spot group.

19. The method of clause 18, wherein the simulated values are adjusted based on the average measurement feedback per hot spot group.

20. The method of any of clauses 18-19, wherein the parameters of the patterning process includes focus and/or exposure.

21. The method of any of clauses 16-17, wherein the measurement feedback is a maximum value of the difference between the measured values and the simulated values.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms;

furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method comprising:
   obtaining (i) a set of hot spots of a patterning process, (ii) measured values of one or more parameters of the patterning process corresponding to the set of hot spots, and (iii) simulated values of the one or more parameters of the patterning process corresponding to the set of hot spots;

determining, via a hardware computer system, a measurement feedback based on the measured values and the simulated values of the one or more parameters of the patterning process; and determining, via computer simulation using a process model of the patterning process, a ranking of a hot spot within the set of hot spots based on the measurement feedback.

2. The method of claim 1, wherein the measurement feedback is a bias function determined as a difference between a first function representing the measured values and a second function representing the simulated values.

3. The method of claim 2, wherein the determining the measurement feedback comprises:
categorizing hot spots within the set of hot spots in one or more categories; and
determining the bias function for a particular category of the hot spot based on the measured values of the one or more parameters of the patterning process and the simulated values of the one or more parameters of the patterning process.

4. The method of claim 3, wherein at least one category of the one or more categories is based on a pattern type and/or on values of one or more parameters of the patterning process.

5. The method of claim 4, wherein at least one category of the one or more categories is based on a pattern type and the pattern type is determined based on geometric shapes of the features within the hot spot.

6. The method of claim 4, wherein at least one category of the one or more categories is based on values of one or more parameters of the patterning process and the one or more parameters of the patterning process include a critical dimension, a dose, and/or a focus.

7. The method of claim 2, wherein the first function and/or the second function is a mathematical model and/or a look up table.

8. The method of claim 2, further comprising determining the bias function, the determining the bias function comprising: determining the first function as one fitting the measured values; determining the second function as one corresponding to the process model of the patterning process used to generate the simulated values; and determining the difference between the first function and the second function.

9. The method of claim 1, wherein the measurement feedback is a maximum value of a difference between the measured values and the simulated values.

10. The method of claim 1, wherein the measurement feedback is an average value of a difference between the measured values and the simulated values corresponding to a category of the hot spot within the set of the hot spots.

11. The method of claim 1, wherein the determining the ranking of the hot spot comprises:
determining a category of one or more hot spots of the set of hot spots;
applying a bias function corresponding to the category to generate a biased version of the one or more hot spots; and
determining, via simulation of a ranking algorithm of the process model of the patterning process, the ranking of the biased hot spot.

12. The method of claim 11, wherein the ranking algorithm includes determining a defect metric corresponding to each hot spot within the set of hot spots, wherein:
the defect metric is evaluated within a focus uncertainty range, and/or
the defect metric is a weighted sum of a difference between a defect size and a threshold defect size at different focus values within a focus uncertainty range.

13. The method of claim 1, further comprising:
guiding an inspection tool to collect measurement data on a printed substrate according to the ranking of the hot spots; and
determining defects on the printed substrate based on the measurement data.

14. The method of claim 1, wherein the determining the measurement feedback is an iterative process, an iteration comprising:
obtaining defect data corresponding to the set of hot spots;
determining a correlation between the defect data and hot spot ranking;
evaluating a level of the correlation; and
responsive to the level of correlation breaching a threshold, determining the measurement feedback.

15. A computer program product comprising a non-transitory computer readable medium having instructions therein, the instructions, when executed by a computer system, configured to cause the computer system to at least:
obtain (i) a set of hot spots of a patterning process, (ii) measured values of one or more parameters of the patterning process corresponding to the set of hot spots, and (iii) simulated values of the one or more parameters of the patterning process corresponding to the set of hot spots;
determine a measurement feedback based on the measured values and the simulated values of the one or more parameters of the patterning process; and
determine, via computer simulation using a process model of the patterning process, a ranking of a hot spot within the set of hot spots based on the measurement feedback.

16. The computer program product of claim 15, wherein the measurement feedback is a bias function determined as a difference between a first function representing the measured values and a second function representing the simulated values.

17. The computer program product of claim 16, wherein the instructions configured to cause the computer system to determine the measurement feedback are further configured to cause the computer system to:
categorize hot spots within the set of hot spots in one or more categories; and
determine the bias function for a particular category of the hot spot based on the measured values of the one or more parameters of the patterning process and the simulated values of the one or more parameters of the patterning process.

18. The computer program product of claim 16, wherein the instructions are further configured to cause the computer system to determine the bias function, the determination of the bias function comprising: determination of the first function as one fitting the measured values; determination of the second function as one corresponding to the process model of the patterning process used to generate the simulated values; and determination of the difference between the first function and the second function.

19. The computer program product of claim 16, wherein the instructions configured to cause the computer system to determine the ranking of the hot spot are further configured to cause the computer system to:
determine a category of one or more hot spots of the set of hot spots;

apply a bias function corresponding to the category to generate a biased version of the one or more hot spots; and determine, via simulation of a ranking algorithm of the process model of the patterning process, the ranking of the biased hot spot.

20. The computer program product of claim 16, wherein the instructions configured to cause the computer system to determine the measurement feedback are further configured to cause the computer system to do so in an iterative process, an iteration thereof comprising:

obtaining of defect data corresponding to the set of hot spots;

determination of a correlation between the defect data and hot spot ranking;

evaluation of a level of the correlation; and responsive to the level of correlation breaching a threshold, determination of the measurement feedback.

21. The computer program product of claim 15, wherein the measurement feedback is a maximum value of a difference between the measured values and the simulated values or an average value of a difference between the measured values and the simulated values corresponding to a category of the hot spot within the set of the hot spots.

* * * * *